United States Patent
Fukuzumi et al.

(10) Patent No.: US 7,095,071 B2
(45) Date of Patent: Aug. 22, 2006

(54) MAGNETIC RANDOM ACCESS MEMORY

(75) Inventors: Yoshiaki Fukuzumi, Yokohama (JP); Shigeki Takahashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/895,074

(22) Filed: Jul. 21, 2004

(65) Prior Publication Data

US 2005/0199926 A1    Sep. 15, 2005

(30) Foreign Application Priority Data

Mar. 12, 2004 (JP) ............... 2004-071458

(51) Int. Cl.
  *H01L 29/76* (2006.01)
  *G11C 11/14* (2006.01)
(52) U.S. Cl. ............... 257/295; 257/E21.665; 257/E43.004; 365/171; 365/173
(58) Field of Classification Search ............. 257/295
  See application file for complete search history.

(56) References Cited

U.S. PATENT DOCUMENTS

| | | | |
|---|---|---|---|
| 5,650,958 A * | 7/1997 | Gallagher et al. | ........... 365/173 |
| 6,081,445 A | 6/2000 | Shi et al. | |
| 6,518,588 B1 * | 2/2003 | Parkin et al. | ................ 257/3 |
| 6,545,906 B1 | 4/2003 | Savtchenko et al. | |
| 6,833,278 B1 * | 12/2004 | Deak | ................ 438/3 |
| 2004/0227172 A1 * | 11/2004 | Park | ............. 257/295 |
| 2005/0199926 A1 | 9/2005 | Fukuzumi et al. | |

FOREIGN PATENT DOCUMENTS

JP    2002-170376    6/2002

OTHER PUBLICATIONS

U.S. Appl. No. 11/232,017, filed Sep. 22, 2005, Fukuzumi.
U.S. Appl. No. 11/224,094, filed Sep. 13, 2005, Fukuzumi.
U.S. Appl. No. 11/245,353, filed Oct. 7, 2005, Nakayama et al.
M. Durlam, et al., "A low power 1Mbit based on 1T1MTJ bit cell integrated with Copper Interconnects", IEEE Symposium on VLSI Circuits Digest of Technical Papers, 2002, 4 Pages.
Takeshi Honda, et al., "MRAM-Writing Circuitry to Compensate for Thermal-Variation of Magnetization-Reversal Current", IEEE Symposium on VLSI Circuits Digest of Technical Papers, 2002, pp. 156-157.
Roy Scheuerlein, et al., "A 10ns Read and Write Non-Volatile Memory Array Using a Magnetic Tunnel Junction and FET Switch in each Cell,", ISSCC Technical Digest, 2000, 6 Pages.

(Continued)

*Primary Examiner*—David Nelms
*Assistant Examiner*—Dao H. Nguyen
(74) *Attorney, Agent, or Firm*—Oblon, Spivak, McClelland, Maier & Neustadt, P.C.

(57) ABSTRACT

According to an aspect of the present invention, there is disclosed a magnetic resistive element comprising a first magnetic layer whose magnetized state changes in accordance with data, a nonmagnetic layer disposed on the first magnetic layer, and a second magnetic layer which is disposed on the nonmagnetic layer and whose magnetized state is fixed, wherein the first magnetic layer has a cross shape in which a maximum length of a first direction is L1 and a maximum length of a second direction crossing the first direction at right angles is L2, and the second magnetic layer has a tetragonal shape in which the maximum length of the first direction is L3 ($\leq$L1) and the maximum length of the second direction is L4 (<L2).

13 Claims, 24 Drawing Sheets

OTHER PUBLICATIONS

A. Bette, et al., "A High-Speed 128Kbit MRAM Core for Future Universal Memory Application", Symposium on VLSI Circuits Digest of Technical Papers, 2003, pp. 217-220.

A. R. Sitaram, et al., "A 0.18μm Logic-based MRAM Technology for High Performance Nonvolatile Memory Applications", Symposium of VLSI Circuits Digest of Technical Papers, 0.14, Jul. 2003, pp. 15-16.

Gitae Jeong, et al., "A 0.24μm 2.0V 1T1MTJ 16kb NV Magnetoresistance RAM with Self Reference Sensing", ISSCC 2003/ Session 16 / Non-Volatile Memory / Paper 16.2, IEEE International Solid-State Circuits Conference, 2003, 6 Pages.

M. Durlam, et al., "Nonvolatile RAM based on Magnetic Tunnel Junction Elements", ISSCC 2000 / Session 7/ TD: Emerging Memory & Device Technologies / Paper TA 7.3, IEEE International Solid-State Circuits Conference, 2000, 6 Pages.

* cited by examiner

MAGNETIC RANDOM ACCESS MEMORY

CROSS-REFERENCE TO RELATED APPLICATIONS

This application is based upon and claims the benefit of priority from prior Japanese Patent Application No. 2004-071458, filed Mar. 12, 2004, the entire contents of which are incorporated herein by reference.

BACKGROUND OF THE INVENTION

1. Field of the Invention

The present invention relates to a magnetic random access memory (MRAM) using a magneto resistive effect.

2. Description of the Related Art

A magnetic random access memory using a tunneling magneto resistive (TMR) effect is described, for example, in Patent Documents 1 to 3 and Non-Patent Documents 1 to 5. These magnetic random access memories are characterized in that data is stored by a magnetized state of a magnetic tunnel junction (MTJ) element.

(1) The data is stored by the magnetized state of the MTJ element as described above in the magnetic random access memory. Therefore, the magnetized state of the MTJ element has to be changed in accordance with a value of written data at a write time.

Here, a configuration of the MTJ element capable of realizing enhancement of a resistance to disturbance has been researched in order to prevent a write error at a write time. At present, it has been confirmed that when the MTJ element is formed in a "cross type", the resistance to disturbance can be enhanced.

However, the MTJ element itself has become very minute in order to realize a large memory capacity. Therefore, for example, when a pattern for the MTJ element is to be formed using a photolithography technique, contour becomes blurred, and a complete cross shape cannot be obtained.

Additionally, concerning the photolithography technique, it is also possible to form the pattern of the MTJ element by application of the lithography technique of the next generation, having a resolution higher than that realized in the present generation, in an experimental, trial production stage.

However, in an actual mass production stage, it is necessary to select the photolithography technique having an optimum resolution from aspects of cost, yield and the like at this time. Therefore, it is impossible to process the MTJ element constantly by the application of a most advanced photolithography technique.

(2) According to the cross type MTJ element, an effect of enhancement of resistance to disturbance can be obtained, but several problems have to be overcome in order to realistically achieve the effect.

For example, concerning a positional relation between a pinned layer (fixed layer) and a free layer (recording layer) of the MTJ element, two types have been known: a bottom pin structure in which the pinned layer is positioned down and the free layer is positioned up with a silicon substrate side down; and a top pin structure in which the pinned layer is positioned up and the free layer is positioned down.

Here, with use of the former bottom pin structure, the pinned layer can be formed in a tetragonal shape, and therefore there is little leak magnetic field from the pinned layer, and fluctuations of a magnetic field between the MTJ elements can be eliminated, but there is a problem that characteristics of a magnetic layer cannot be enhanced.

Moreover, with the use of the latter top pin structure, it is possible to obtain an advantage that the characteristics of the magnetic layer can be enhanced. However, since the pinned layer is also formed in a cross type, the leak magnetic field from the pinned layer becomes remarkably non-uniform, and a problem occurs that the fluctuations of the magnetic field between the MTJ elements are also increased because of fluctuations of the shape of the MTJ element.

Patent Documents 1 to 3 and Non-Patent Documents 1 to 5 are as follows:

Patent Document 1: Jpn. Pat. Appln. KOKAI Publication No. 2002-170376;

Patent Document 2: U.S. Pat. No. 6,545,906;

Patent Document 3: U.S. Pat. No. 6,081,445;

Non-Patent Document 1: M. Durlam et al. "A Low Power 1 Mbit MRAM based on 1T1M TJ Bit Cell integrated with Copper Interconnects", IEEE, 2002 Symposium on VLSI Circuits Digest of Technical Papers;

Non-Patent Document 2: T. HONDA et al. "MRAM-Writing Circuitry to compensate for Thermal-Variation of Magnetization-Reversal Current", 2002 Symposium on VLSI Circuits Digest of Technical Papers, pp. 156 to 157, July 2002;

Non-Patent Document 3: Roy Scheuerlein et al. "A 10 ns Read and Write Nonvolatile Memory Array using a Magnetic Tunnel Junction and FET Switch in each Cell", ISSCC2000 Technical Digest, pp. 128 to 129;

Non-Patent Document 4: A Bette et al. "A High-Speed 128 Kbit MRAM Core for Future Universal Memory Applications", 2003 Symposium on VLSI Circuits Digest of Technical Papers, pp. 217 to 220, July 2003; and Non-Patent Document 5: A. R. Sitaram et al. "A 0.18 um Logic-based MRAM Technology for High Performance Nonvolatile Memory Applications", 2003 Symposium on VLSI Circuits Digest of Technical Papers, 0.14, July 2003.

BRIEF SUMMARY OF THE INVENTION

According to an aspect of the present invention, there is provided a magneto resistive element comprising: a first magnetic layer whose magnetized state changes in accordance with data; a nonmagnetic layer disposed on the first magnetic layer; and a second magnetic layer which is disposed on the nonmagnetic layer and whose magnetized state is fixed, wherein the first magnetic layer has a cross shape in which a maximum length of a first direction is L1 and a maximum length of a second direction crossing the first direction at right angles is L2, and the second magnetic layer has a tetragonal shape in which the maximum length of the first direction is L3 ($\leq$L1) and the maximum length of the second direction is L4 (<L2).

According to another aspect of the present invention, there is provided a magnetic random access memory comprising: a magneto resistive element comprising a first magnetic layer whose magnetized state changes in accordance with data, a second magnetic layer whose magnetized state is fixed, and a nonmagnetic layer disposed between the first and second magnetic layers; a conductive line disposed above the magneto resistive element; and a contact pillar which connects the magneto resistive element to the conductive line, wherein at least the first magnetic layer of the magneto resistive element has a cross shape in which a maximum length of a first direction is L1 and a maximum length of a second direction crossing the first direction at right angles is L2, and the contact pillar has a tetragonal shape in which the maximum length of the first direction is D1 (≦L1) and the maximum length of the second direction is D2 (<L2).

According to a further aspect of the present invention, there is provided a method of manufacturing a semiconductor device, comprising: a step of forming a layer to be etched; a step of forming a first layer on the layer to be etched; a step of forming a pattern extending in a first direction on the first layer using a first photolithography process; a step of forming a third layer having a pattern extending in a second direction intersecting with the first direction on the second layer using a second photolithography process; and a step of etching the first layer using the second and third layers as a mask to form the first layer in a cross shape.

DETAILED DESCRIPTION OF THE INVENTION

A magnetic random access memory of an aspect of the present invention will be described below in detail with reference to the accompanying drawing.

First, a shape of an MTJ element in which there is little leak magnetic field from the pinned layer and characteristics of a magnetic layer can also be enhanced will be described together with the shape of the MTJ element as a reference example. Thereafter, a device structure will be described capable of reducing a distance between a yoke material (a magnetic material) of a write line and a free layer of the MTJ element. Moreover, finally a process for obtaining a cross type MTJ element having little shape fluctuation between the devices without blurring a contour will be described.

1. Shape of MTJ Element

Figure 1:
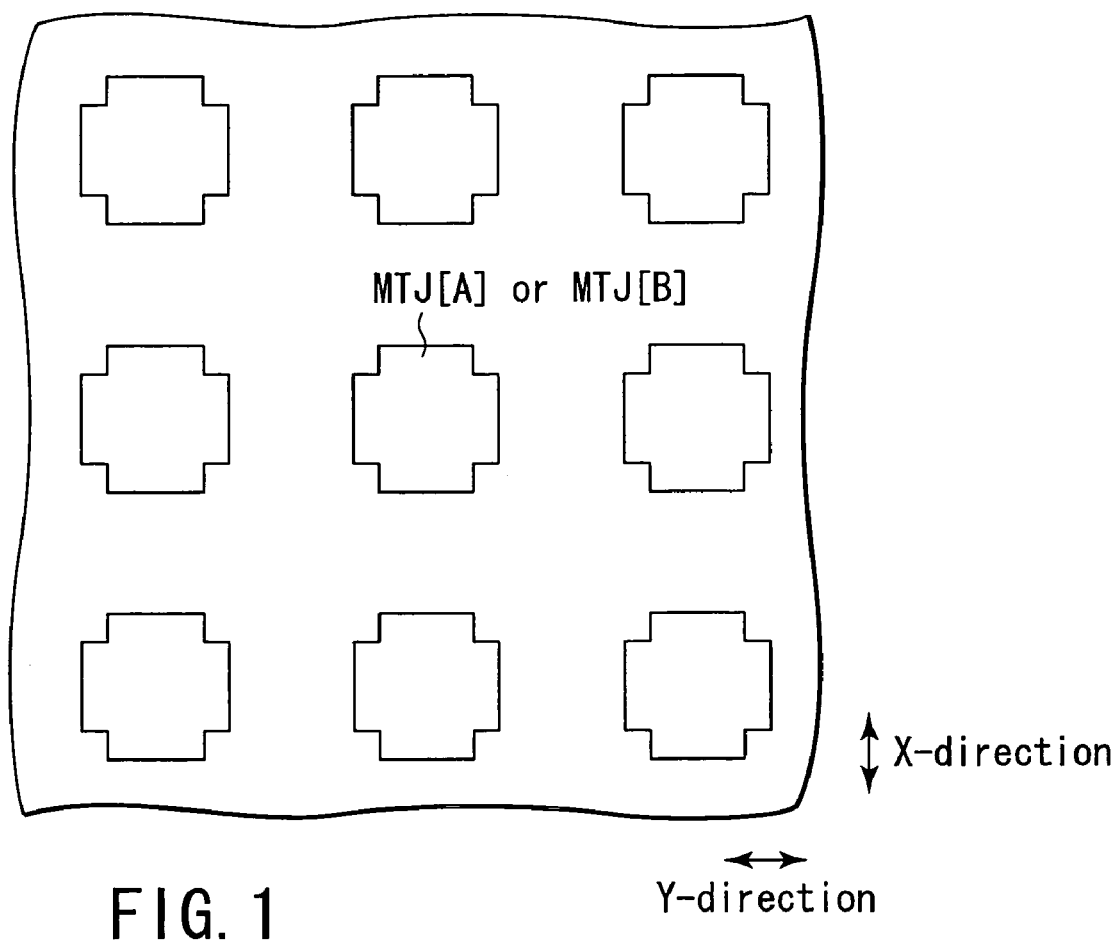
FIG. 1 is a plan view showing a shape of an MTJ element as a reference example.
Figure 2:
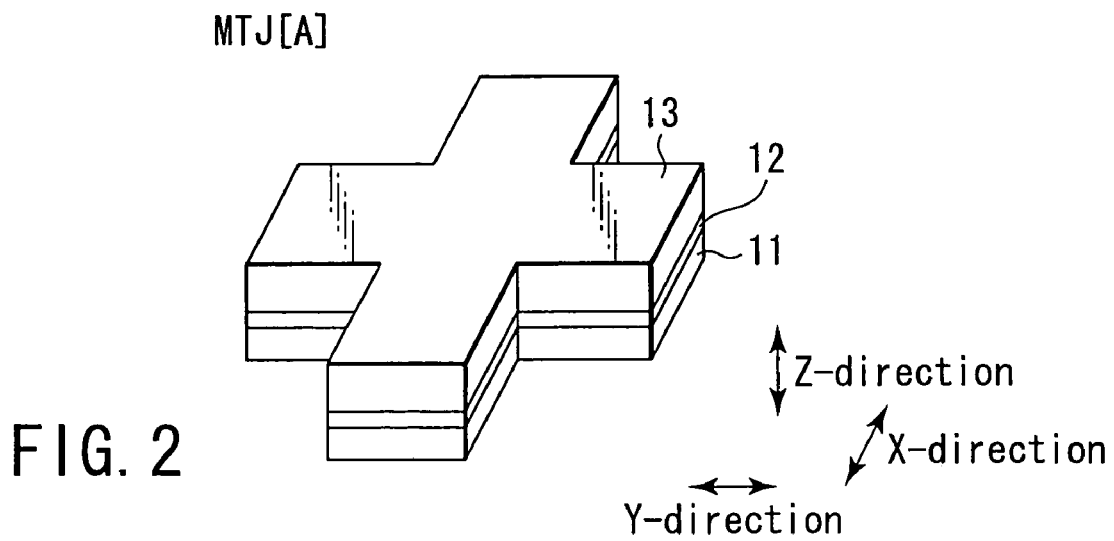
FIG. 2 is a perspective view showing the shape of the MTJ element as the reference example.
Figure 3:
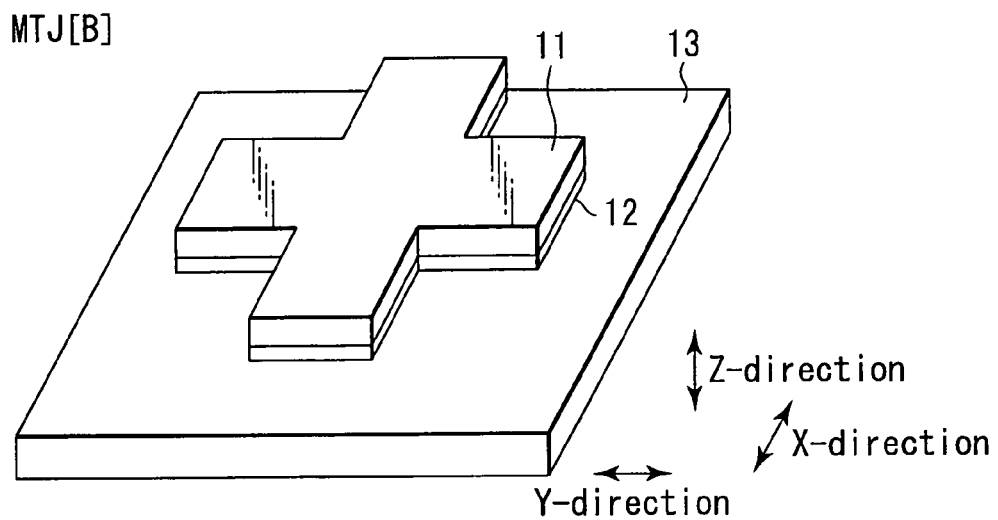
FIG. 3 is a perspective view showing the shape of the MTJ element as the reference example.

FIGS. 1 to 3 show the shape of the MTJ element as a reference example of the present invention.

As shown in FIG. 1, for example, MTJ elements (MTJ[A] or MTJ[B]) are arranged in an array form on a silicon substrate. The MTJ element has a cross shape.

(1) Cross Type MTJ Element of Top Pin Structure

FIG. 2 shows a cross type MTJ element of a top pin structure.

The MTJ element MTJ[A] comprises a free layer (recording layer) 11, a tunnel insulating layer 12, and a pinned layer (fixed layer) 13.

The free layer 11 comprises a ferromagnetic body, and a magnetized state of the layer changes in accordance with a value of written data. The tunnel insulating layer 12 comprising a nonmagnetic body is formed on the free layer 11. The tunnel insulating layer 12 may also comprise a single layer or a plurality of layers. The pinned layer 13 is formed on the tunnel insulating layer 12. The pinned layer 13 comprises the ferromagnetic body, and has a constant magnetized state regardless of the value of the written data.

In this structure, the pinned layer 13 of the MTJ element has a cross shape. Therefore, a leak magnetic field from the pinned layer 13 is remarkably non-uniform, and a fluctuation of a magnetic field between the MTJ element also increases because of a fluctuation of the shape of the MTJ element.

(2) Cross Type MTJ Element of Bottom Pin Structure

FIG. 3 shows a cross type MTJ element of a bottom pin structure.

The MTJ element MTJ[B] comprises a free layer (recording layer) 11, a tunnel insulating layer 12, and a pinned layer (fixed layer) 13.

The pinned layer 13 has a tetragonal shape. The pinned layer 13 comprises a ferromagnetic body, and the layer has a constant magnetized state regardless of the value of the written data. The tunnel insulating layer 12 comprising a nonmagnetic body is formed on the pinned layer 13. The tunnel insulating layer 12 may also comprise a single layer or a plurality of layers. The free layer 11 is formed on the tunnel insulating layer 12. The free layer 11 comprises a ferromagnetic body, and the magnetized state of the layer changes in accordance with the value of the written data.

In this structure, the pinned layer 13 of the MTJ element has a tetragonal shape. Therefore, it is possible to reduce a distribution of the leak magnetic field from the pinned layer 13 inside the MTJ element. However, in this structure, a magnitude of the leak magnetic field changes by a positional deviation generated at a time of the forming of the pinned layer 13 and free layer 11, and it is difficult to obtain stable magnetic characteristics.

(3) Improved Cross Type MTJ Element of Top Pin Structure

Figure 4:
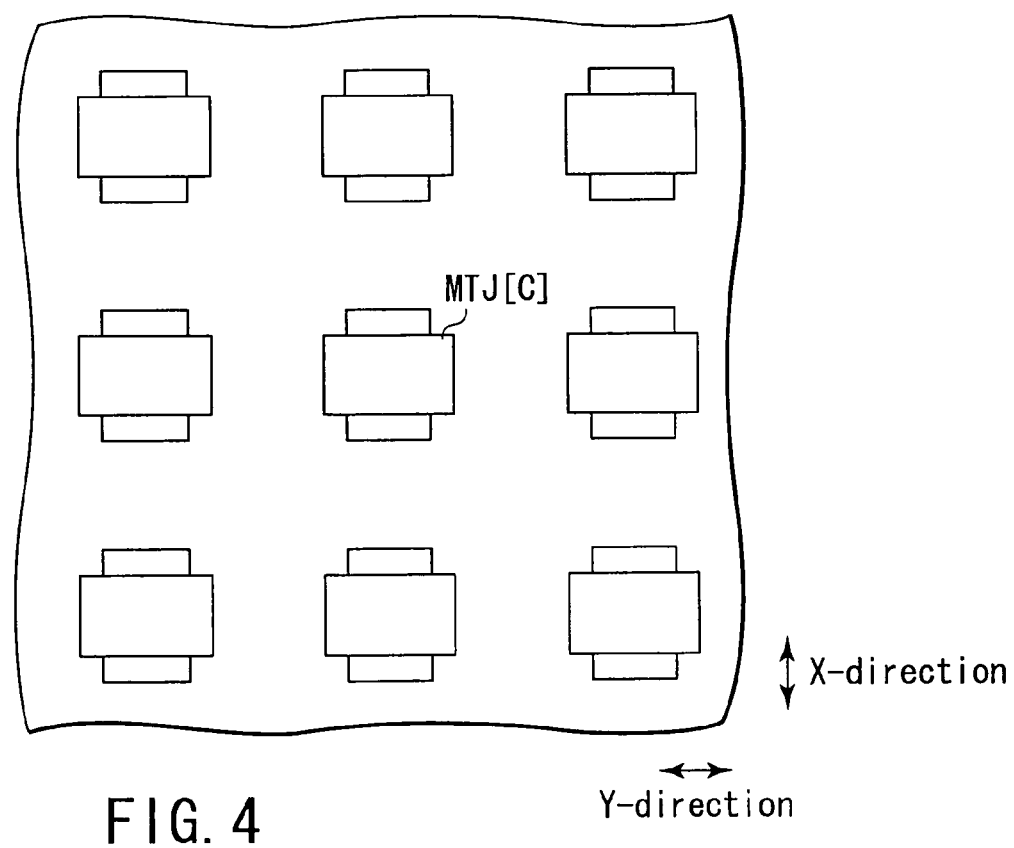
FIG. 4 is a plan view showing the shape of the MTJ element according to an example of the present invention.
Figure 5:
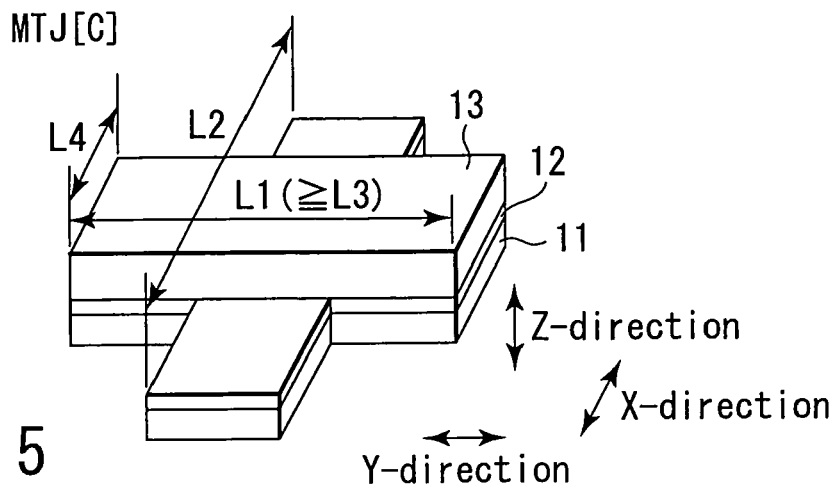
FIG. 5 is a perspective view showing the shape of the MTJ element according to the example of the present invention.

FIGS. 4 and 5 show the shape of an MTJ element according to an example of the present invention.

As shown in FIG. 4, MTJ elements MTJ[C] are arranged in an array form on a silicon substrate. The MTJ element has a cross shape.

The MTJ element MTJ[C] has a top pin structure, and comprises a free layer (recording layer) 11, a tunnel insulating layer 12, and a pinned (fixed layer) 13.

The free layer 11 comprises a ferromagnetic body, and the magnetized state of the layer changes in accordance with the value of the written data. The tunnel insulating layer 12 comprising a nonmagnetic body is formed on the free layer 11. The tunnel insulating layer 12 may also comprise a single layer or a plurality of layers. The pinned layer 13 is formed on the tunnel insulating layer 12. The pinned layer 13 comprises the ferromagnetic body, and has a constant magnetized state regardless of the value of the written data.

Here, in the example of the present invention, the free layer 11 and tunnel insulating layer 12 of the MTJ element has a cross shape in which a maximum length of a Y-direction is L1 and a maximum length of an X-direction is L2. L1 and L2 may also be equal or different.

Moreover, the pinned layer 13 of the MTJ element has a tetragonal shape in which the maximum length of the Y-direction is L3 and the maximum length of the X-direction is L4. L3 is equal to or smaller than L1, and L4 is smaller than L2. Since L3 is larger than L4, the pinned layer 13 of the MTJ element has a rectangular shape long in the Y-direction.

In general, the shape of the MTJ element according to the example of the present invention can be represented as follows. A ratio (aspect ratio: L1/L2) of the maximum length L1 of the Y-direction to the maximum length L2 of the X-direction crossing the Y-direction at right angles in the free layer 11 is smaller than a ratio (aspect ratio: L3/L4) of the maximum length L3 of the Y-direction to the maximum length L4 of the X-direction in the pinned layer 13, and L2>L4.

It is to be noted that the Y-direction may also be parallel to a magnetization ease axis or a magnetization difficulty axis of the MTJ element.

According to the structure, the leak magnetic field from the pinned layer 13 of the MTJ element can be reduced, and the fluctuation of the magnetic field between the MTJ elements can be eliminated. Additionally, characteristics of the magnetic layer can also be enhanced.

(4) Conclusion

Figure 6:
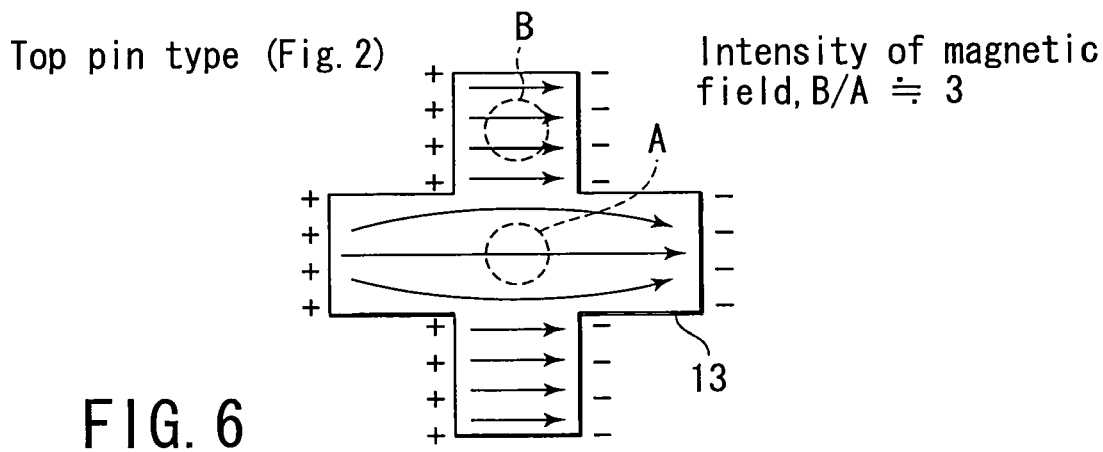
FIG. 6 is a diagram showing a magnetic field generated in the MTJ element of FIG. 2.
Figure 7:
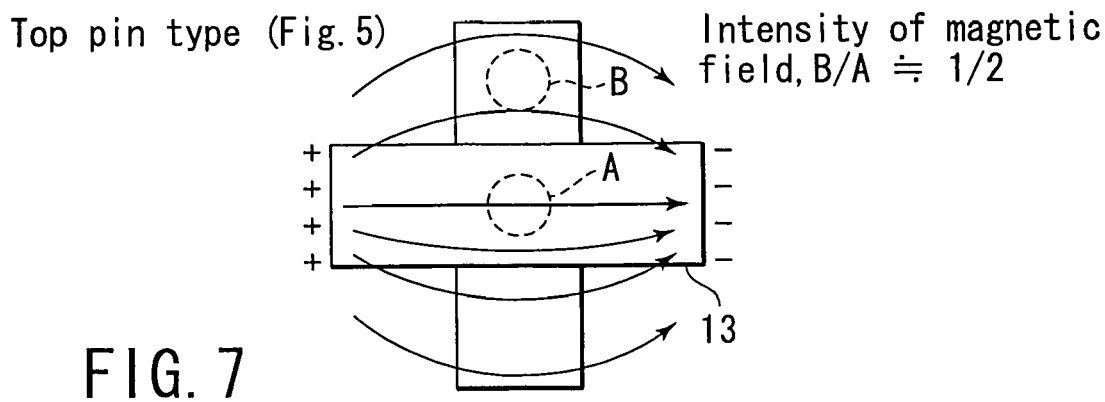
FIG. 7 is a diagram showing the magnetic field generated in the MTJ element of FIG. 5.

As shown in FIG. 6, a problem of the MTJ element having the top pin structure has lied in that the pinned layer also has a cross shape, and therefore a magnetic field strength of an end portion B of the MTJ element is about three times that of a central portion A. In the example of the present invention, as shown in FIG. 7, when the pinned layer is formed in a tetragonal shape (e.g., rectangular shape), the magnetic field strength of the end portion B of the MTJ element can be set to about ½ of the magnetic field strength of the central portion A. That is, a uniform magnetic field in the MTJ element can be realized, and the fluctuation of the magnetic field between the MTJ elements can be eliminated.

2. Device Structure (1) FIRST EXAMPLE

Figure 8:
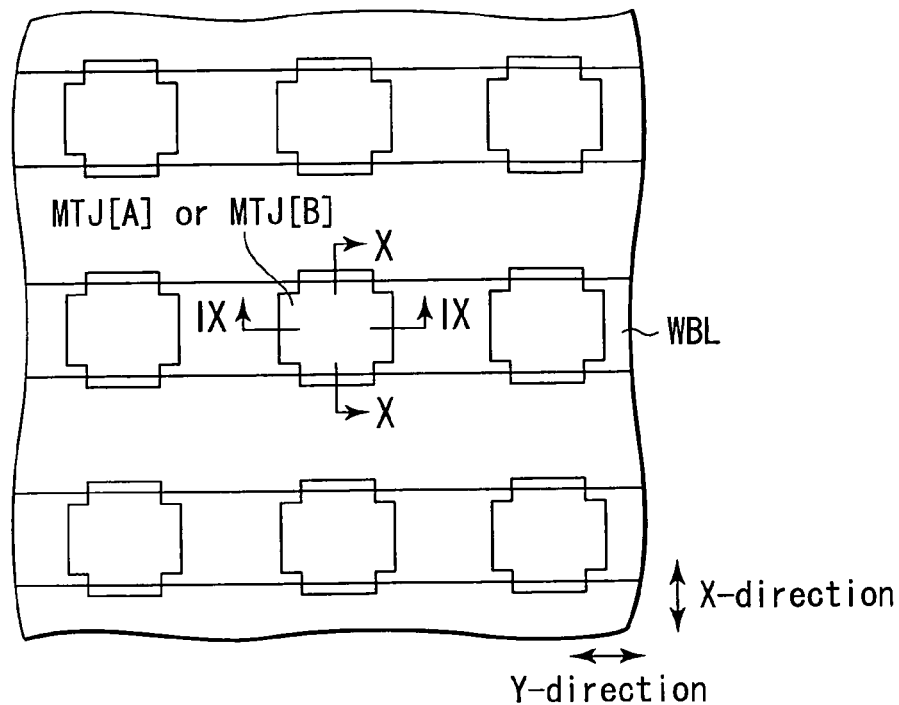
FIG. 8 is a plan view showing a device structure according to a first example of the present invention.
Figure 9:
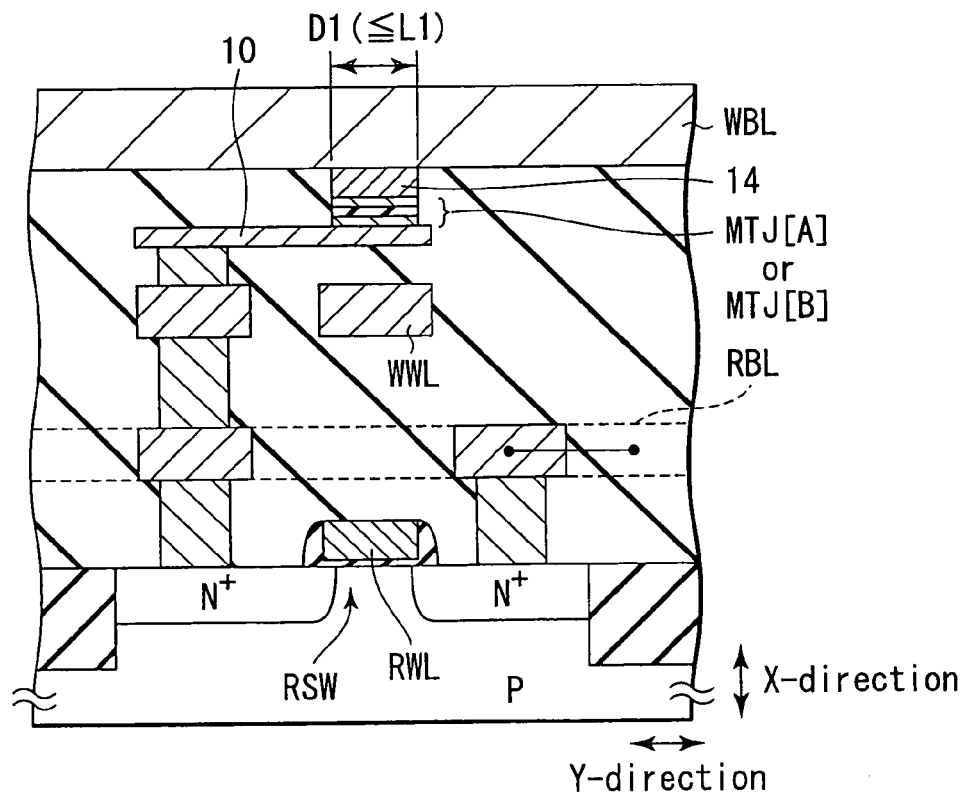
FIG. 9 is a sectional view along a IX—IX line of FIG. 8.
Figure 10:
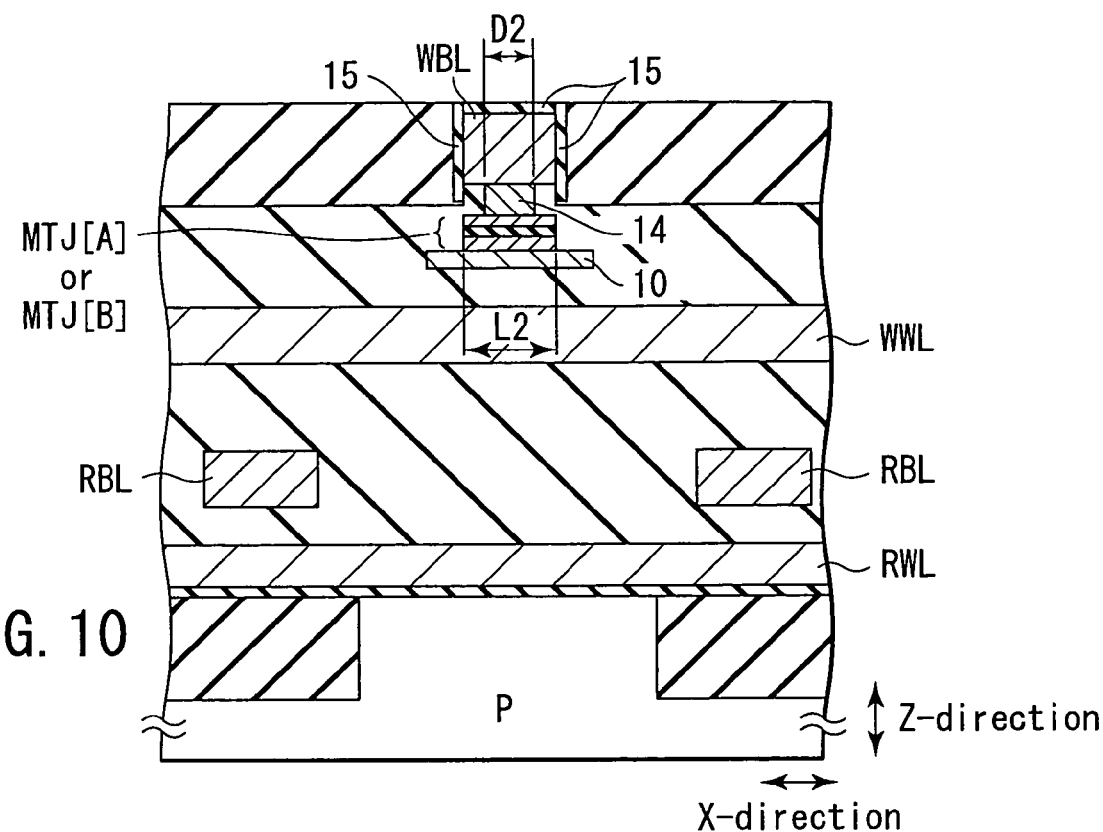
FIG. 10 is a sectional view along a X—X line of FIG. 8.

FIGS. 8 to 10 show a device structure of a memory cell according to an example of the present invention. FIG. 9 shows a cross section along a IX—IX line of FIG. 8, and FIG. 10 shows a cross section along a X—X line of FIG. 8.

A first example is an example of a device structure in which the MTJ element MTJ[A] of FIG. 2 or the MTJ element MTJ[C] of FIG. 3 is used.

In a surface region of a P-type silicon substrate, an N-channel MOS transistor is formed as a read selection switch RSW. A gate of this transistor forms a read word line RWL, and extends, for example, in the X-direction.

One of two source/drain regions of the N-channel MOS transistor as the read selection switch RSW is connected to a read bit line RBL. The read bit line RBL extends, for example, in a Y-direction, and is connected to a read circuit (including a sense amplifier). The other source/drain region is connected to a conductive plate 10.

The cross type MTJ element (MTJ[A] or MTJ[B]) is disposed on the conductive plate 10. A write word line WWL extending in the X-direction is disposed right under the MTJ element. The write word line WWL is distant from the MTJ element by a certain distance.

A contact pillar (conductive body) 14 is disposed in the MTJ element. The contact pillar 14 has a tetragonal shape, for example, a rectangular shape long in the Y-direction. Here, for example, the Y-direction is vertical to the magnetization ease axis of the MTJ element. In the present example, a long side D1 of the contact pillar 14 is equal to the maximum length L1 of the MTJ element in the Y-direction, and a short side D2 of the contact pillar 14 is shorter than the maximum length L2 of the MTJ element in the X-direction.

In the example of the present invention, the shapes of the MTJ element and contact pillar 14 can be represented as follows. A ratio (aspect ratio: L1/L2) of the maximum length L1 of the Y-direction to the maximum length L2 of the X-direction crossing the Y-direction at right angles in at least the free layer of the MTJ element is smaller than a ratio (aspect ratio: D1/D2) of the maximum length D1 of the Y-direction to the maximum length D2 of the X-direction in the contact pillar 14, and L2>D2.

A write bit line WBL extending in the Y-direction is disposed on the contact pillar 14. The write bit line WBL is electrically connected to the MTJ element via the contact pillar 14.

Yoke materials 15 are disposed on the upper and side surfaces of the write bit line WBL.

Here, in the present example, since the position of the bottom surface of the yoke material 15 is lower than that of the bottom surface of the write bit line WBL, a distance between the yoke material 15 and the free layer of the MTJ element is short, and the magnetic field generated by a current passed in the write bit line WBL can be efficiently supplied to the free layer of the MTJ element.

According to this device structure, since the contact pillar 14 can be used as a hard mask to etch the MTJ element, and a height of the contact pillar can be adjusted at an etching time, subsequently the write bit line WBL and yoke material 15 can be easily formed.

(2) SECOND EXAMPLE

Figure 11:
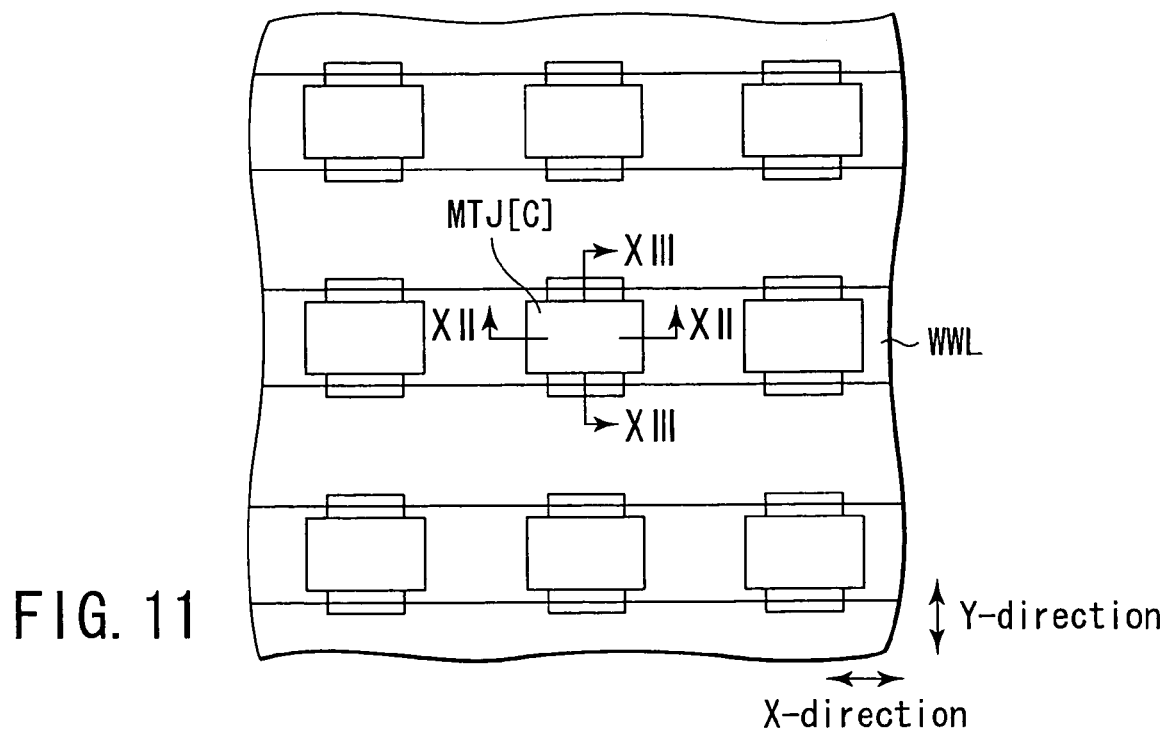
FIG. 11 is a plan view showing the device structure according to a second example of the present invention.
Figure 12:
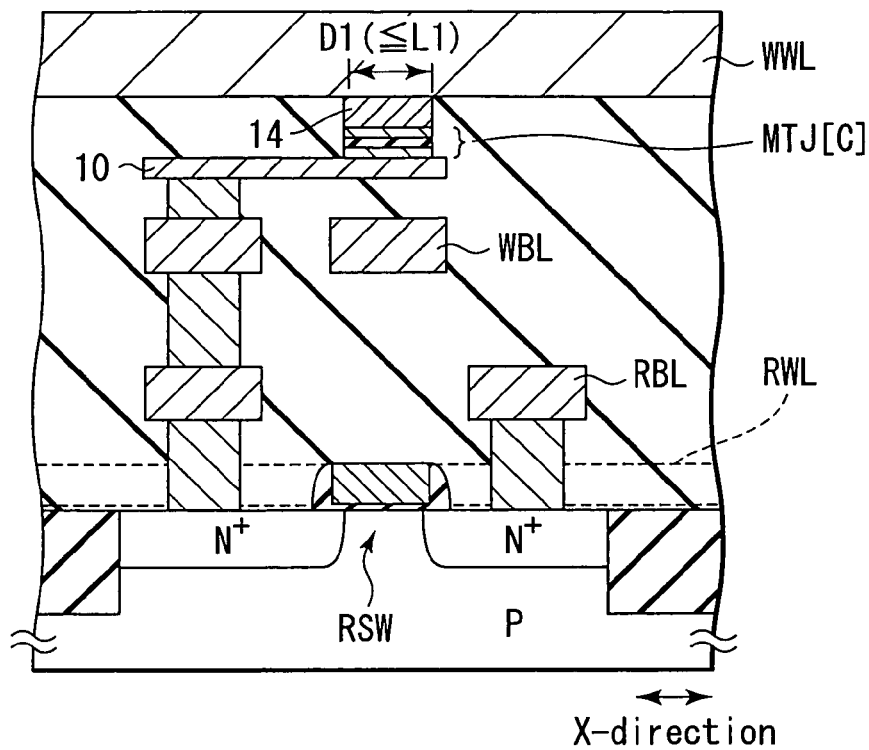
FIG. 12 is a sectional view along a XII—XII line of FIG. 11.
Figure 13:
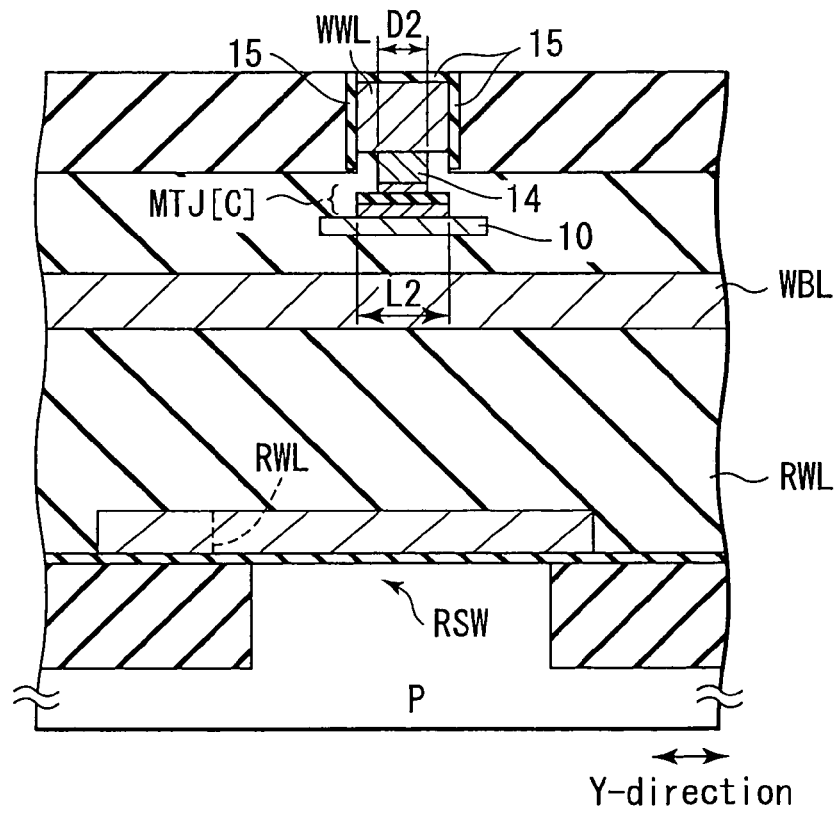
FIG. 13 is a sectional view along a XIII—XIII line of FIG. 11.

FIGS. 11 to 13 show the device structure of the memory cell according to an example of the present invention. FIG. 12 shows a cross section along a XII—XII line of FIG. 11, and FIG. 13 is a cross section along a XIII—XIII line of FIG. 11.

A second example is an example of a device structure in which the MTJ element MTJ[C] of FIG. 5 is used.

In the surface region of a P-type silicon substrate, an N-channel MOS transistor is formed as the read selection switch RSW. The gate of this transistor forms the read word line RWL, and extends, for example, in the X-direction.

One of two source/drain regions of the N-channel MOS transistor as the read selection switch RSW is connected to the read bit line RBL. The read bit line RBL extends, for example, in the Y-direction, and is connected to the read circuit (including the sense amplifier). The other source/drain region is connected to the conductive plate 10.

The cross type MTJ element MTJ[C] is disposed on the conductive plate 10. The write bit line WBL extending in the Y-direction is disposed right under the MTJ element. The write bit line WBL is distant from the MTJ element by a certain distance.

The contact pillar (conductive body) 14 is disposed on the MTJ element. The contact pillar 14 has a tetragonal shape, for example, a rectangular shape long in the X-direction. Moreover, in the present example, the shape of the contact pillar 14 is the same as that of the pinned layer of the MTJ element. That is, the pinned layer also has the tetragonal shape, for example, a rectangular shape long in the X-direction.

The magnetization ease axis of the MTJ element is, for example, parallel to the X-direction.

The long side D1 of the contact pillar 14 or the pinned layer is equal to the maximum length L1 of the MTJ element in the X-direction, and the short side D2 of the contact pillar 14 or the pinned layer is shorter than the maximum length L2 of the MTJ element in the Y-direction.

In the example of the present invention, the shapes of the MTJ element and contact pillar 14 can be represented as follows. A ratio (aspect ratio: L1/L2) of the maximum length L1 of the Y-direction to the maximum length L2 of the X-direction crossing the Y-direction at right angles in at least the free layer of the MTJ element is smaller than a ratio (aspect ratio: D1/D2) of the maximum length D1 of the Y-direction to the maximum length D2 of the X-direction in the pinned layer and contact pillar 14 of the MTJ element, and L2>D2.

A write word line (also serving as the read line) WWL extending in the X-direction is disposed on the contact pillar 14. The write word line WWL is electrically connected to the MTJ element via the contact pillar 14.

The yoke materials 15 are disposed on the upper and side surfaces of the write word line WWL.

Also in the present example, since the position of the bottom surface of the yoke material 15 is set to be lower than that of the bottom surface of the write word line WWL. Accordingly, the distance between the yoke material 15 and the free layer of the MTJ element is short. As a result, the magnetic field generated by a current passed in the write word line WWL can be efficiently supplied to the free layer of the MTJ element.

Also in this device structure, since the contact pillar 14 can be used as a hard mask to etch the MTJ element, and the height of the contact pillar can be adjusted at the etching time, subsequently the write word line WWL and yoke material 15 can be easily formed.

3. Manufacturing Method

A method of manufacturing a cross type MTJ element in which a contour is not blurred and there is little fluctuation of the shape between the devices will be described. Any of the manufacturing methods has characteristics that mutually intersecting line & space masks are formed and the MTJ element is formed in an intersecting portion.

(1) Manufacturing Method 1

Figure 14:
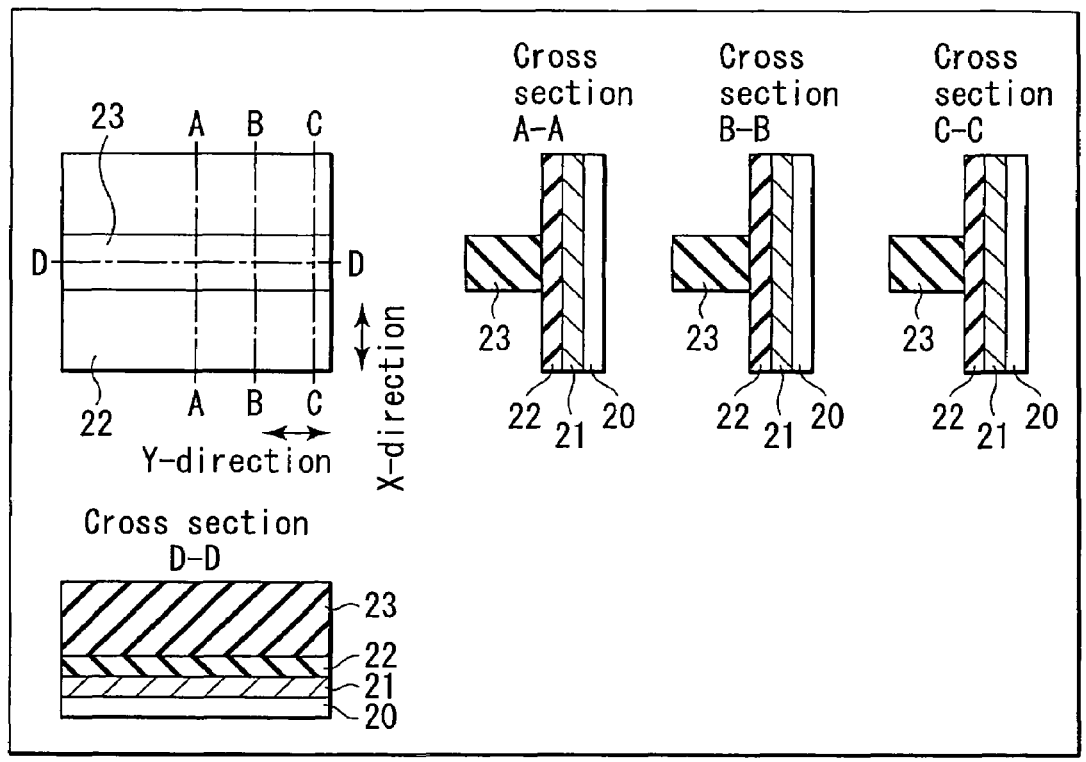
FIG. 14 is a diagram showing a step of Manufacturing Method 1 according to the example of the present invention.

First, as shown in FIG. 14, a laminate layer 20 including a magnetic layer which is a material of the MTJ element is formed. Subsequently, a metal layer 21 formed of aluminum is formed on the laminate layer 20, and first and second insulating layers 22, 23 are formed on the metal layer 21.

Here, a cap layer (e.g., Ru) may also be disposed between the laminate layer 20 and metal layer 21. When the cap layer is disposed, the cap layer is worked simultaneously with the pinned layer (MTJ[A] and MTJ[C]) or the free layer (MTJ[B]), and has the same shape as that of the pinned layer or the free layer. The cap layer is used for preventing the pinned layer or the free layer from being deteriorated at a working time.

Both the first and second insulating layers 22, 23 may also be formed of oxide materials such as silicon oxide, or mutually different materials having an etching selection ratio (e.g., silicon oxide and silicon nitride).

Moreover, first photolithography is performed to form a photo mask (resist) of line & space extending in the Y-direction. The second insulating layer 23 is etched using the photo mask as a mask to form a linear second insulating layer 23 extending in the Y-direction. Thereafter, for example, the photo mask is removed by ashing.

According to the line & space pattern in which lines and spaces are periodically repeated, as compared with a case where the MTJ element is formed only by isolated lines, a process margin of a lithography step can be enlarged.

Figure 15:
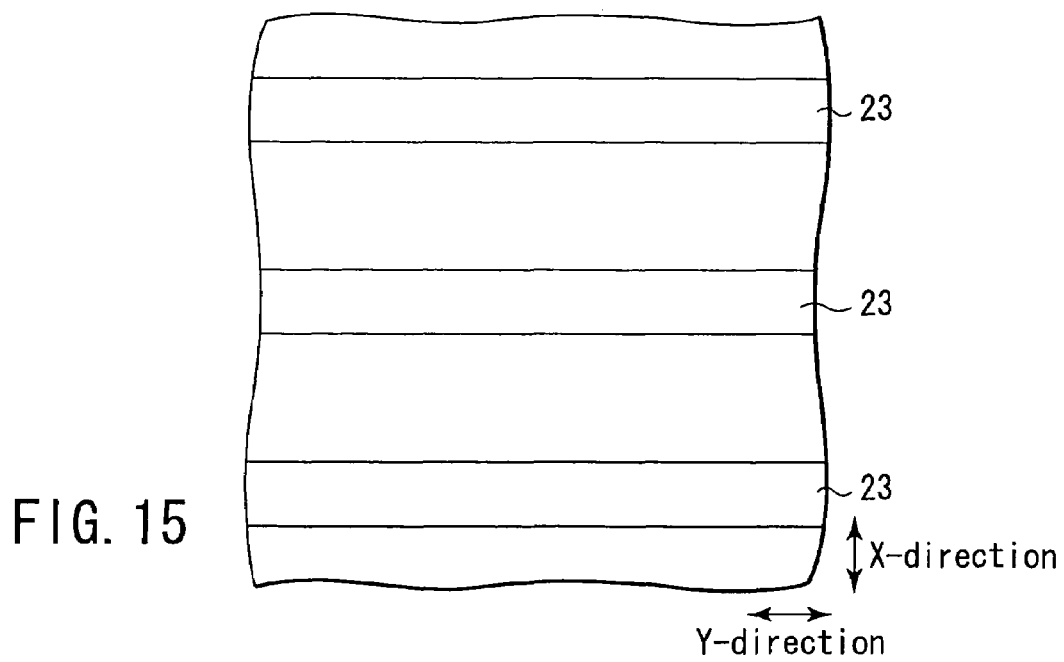
FIG. 15 is a diagram showing a step of Manufacturing Method 1 according to the example of the present invention.

It is to be noted that in FIG. 15, an area of a plan view of FIG. 14 is further enlarged, and the line & space pattern is shown for ease of seeing.

Figure 16:
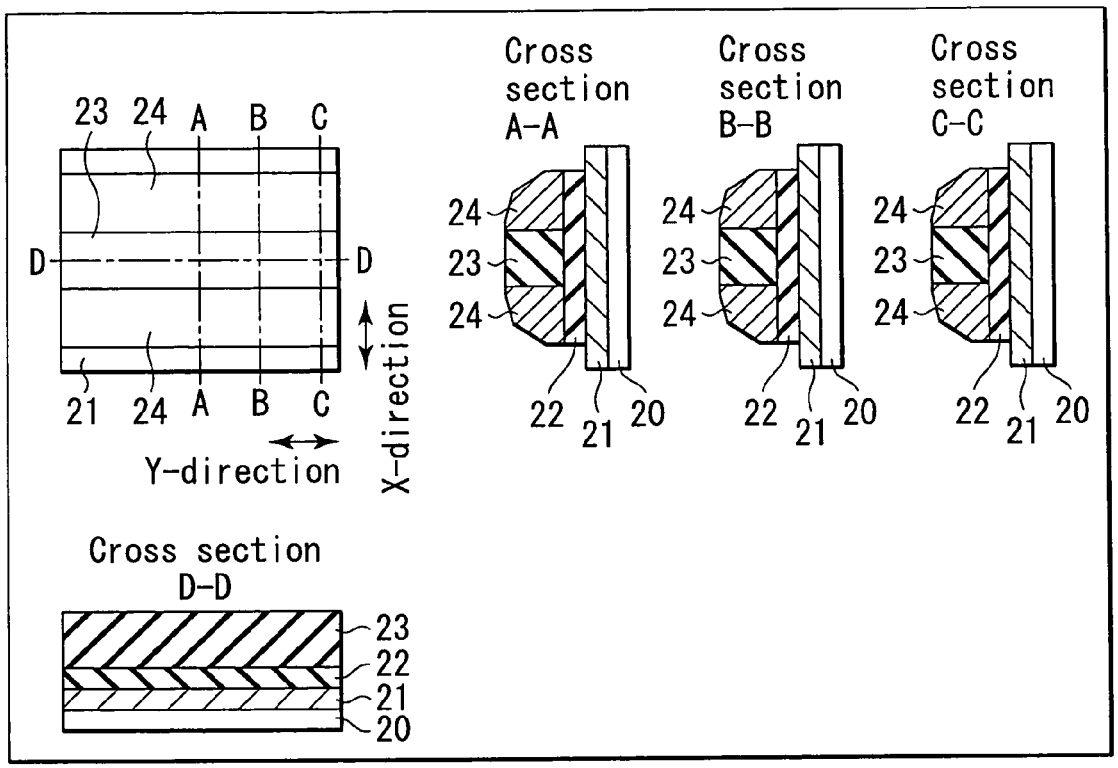
FIG. 16 is a diagram showing a step of Manufacturing Method 1 according to the example of the present invention.

Next, as shown in FIG. 16, an amorphous silicon layer 24 is formed, and this amorphous silicon layer 24 is etched by RIE. As a result, a side wall comprising the amorphous silicon layer 24 is formed on the side wall of the second insulating layer 23.

Subsequently, the first insulating layer 22 is etched using the second insulating layer 23 and amorphous silicon layer 24 as the mask by RIE. As a result, the first insulating layer 22 remains only right under the side wall comprising the second insulating layer 23 and amorphous silicon layer 24.

Figure 17:
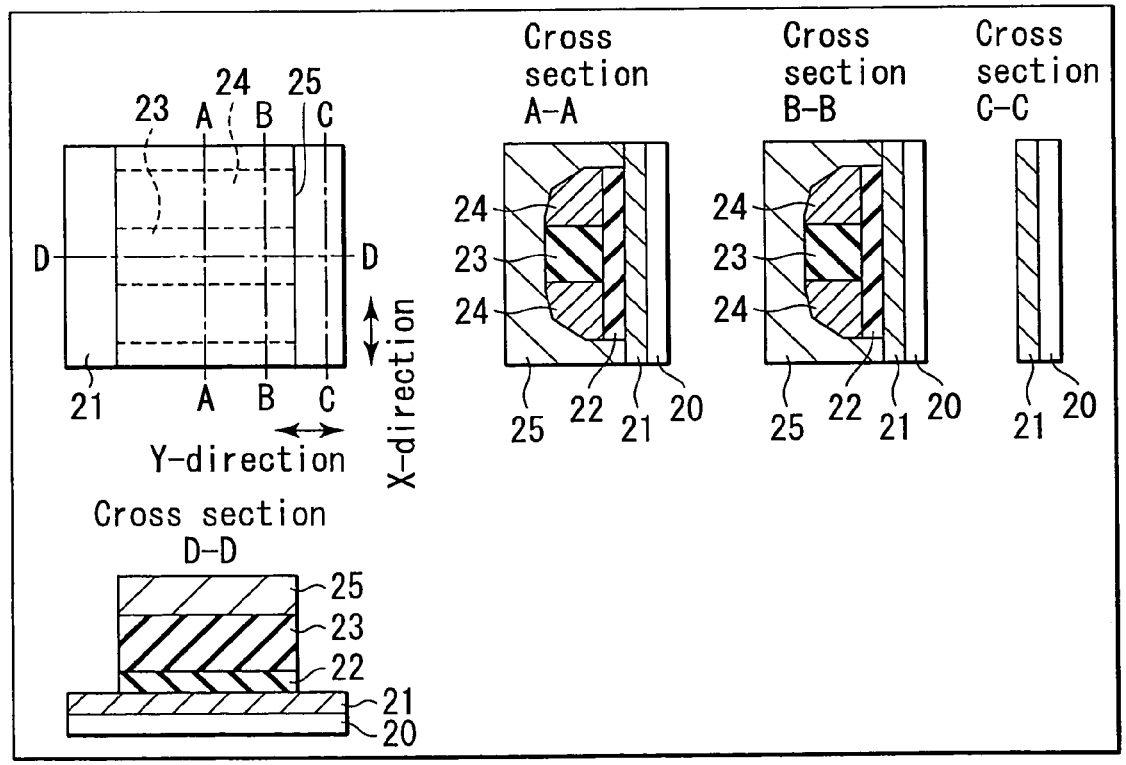
FIG. 17 is a diagram showing a step of Manufacturing Method 1 according to the example of the present invention.

Next, as shown in FIG. 17, an amorphous silicon layer 25 is formed again.

Moreover, second photolithography is performed to form the photo mask (resist) of the line & space extending in the X-direction. The first and second insulating layers 22, 23 and amorphous silicon layers 24, 25 are etched using the photo mask as a mask. As a result, linear amorphous silicon layers 24, 25 extending in the X-direction are formed. Thereafter, the photo mask is removed, for example, by ashing.

Here, the line & space pattern is used. Accordingly, as compared with a case where the MTJ element is formed only by isolated lines, the process margin of the lithography step can be enlarged.

Figure 18:
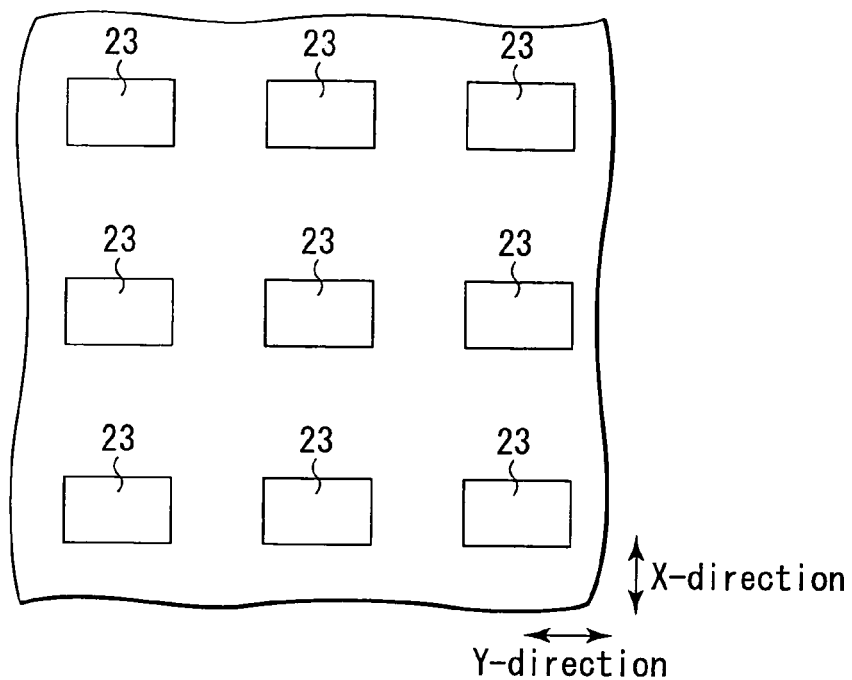
FIG. 18 is a diagram showing a step of Manufacturing Method 1 according to the example of the present invention.

It is to be noted that FIG. 18 shows the pattern of the second insulating layer 23 at a time when the process of FIG. 17 is ended in such a manner that the pattern is easily seen.

Here, one modification will be described.

Figure 47:
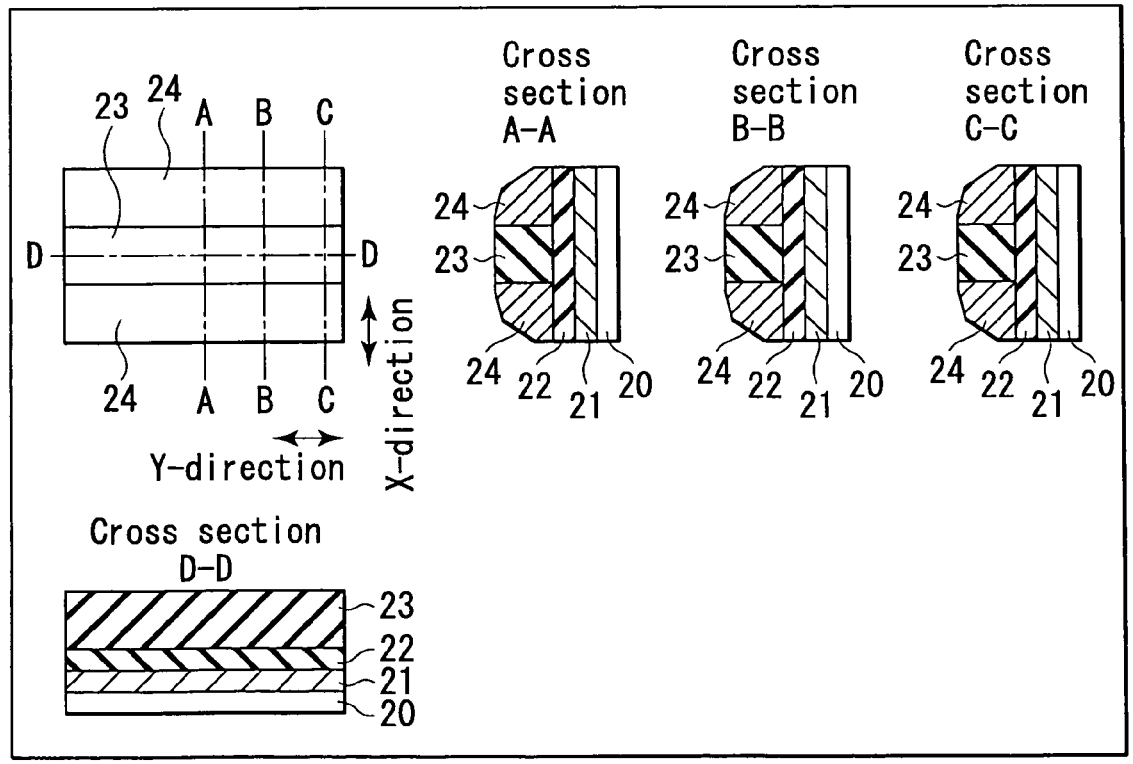
FIG. 47 is a diagram showing a step of a modification of Manufacturing Method 1 according to the example of the present invention.
Figure 48:
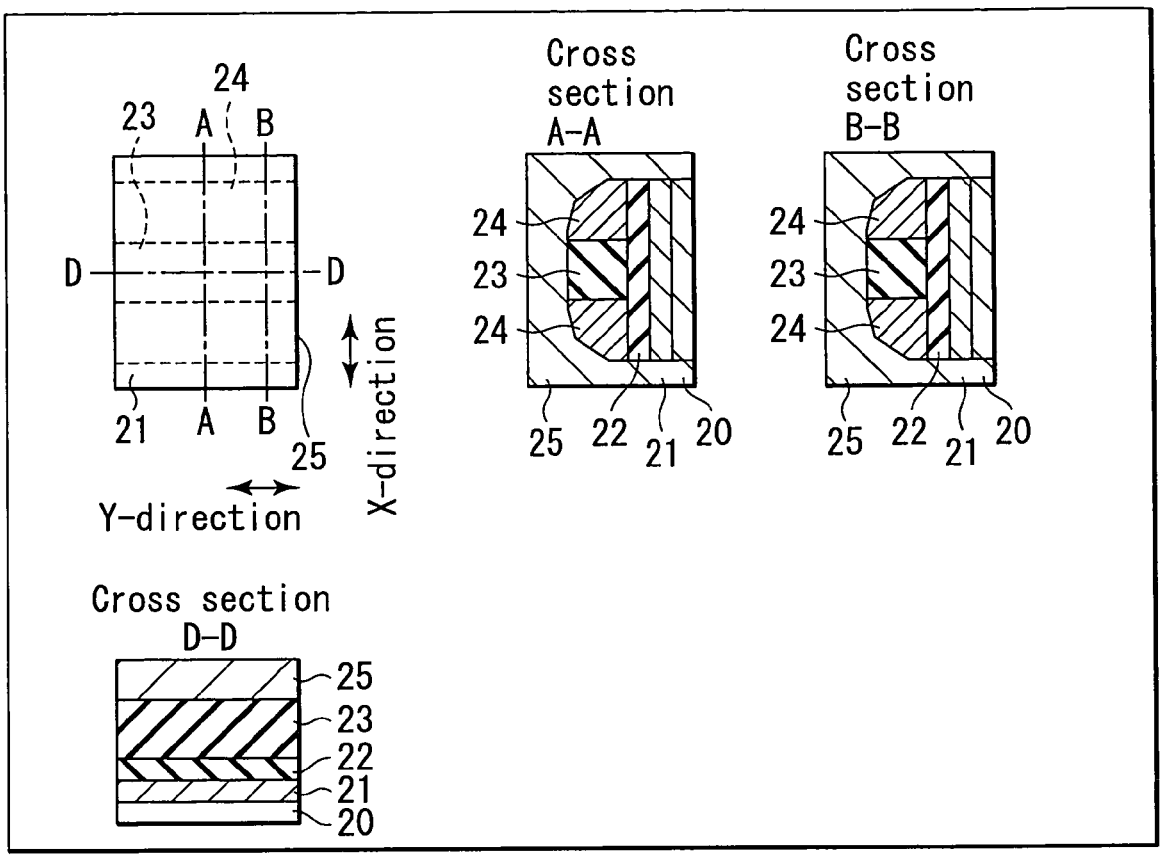
FIG. 48 is a diagram showing a step of a modification of Manufacturing Method 1 according to the example of the present invention.

In the stage of FIG. 16, for example, as shown in FIG. 47, following the etching of the first insulating layer 22, the metal layer 21 and laminate layer 20 may also be etched by RIE using the second insulating layer 23 and amorphous silicon layer 24 as a mask (see A—A, B—B, C—C cross sections). Moreover, in the stage of FIG. 17, for example, as shown in FIG. 48, following the etching of the first insulating layer 22, the metal layer 21 and laminate layer 20 may also be etched by RIE (see D—D cross section).

Figure 49:
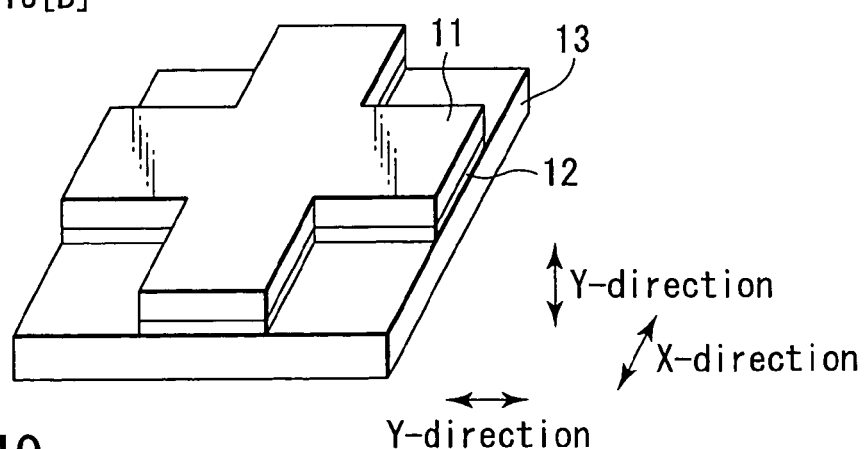
FIG. 49 is a diagram showing a step of a modification of Manufacturing Method 1 according to the example of the present invention.

In this case, for example, when the MTJ element [B] is formed, as shown in FIG. 49, the side surfaces of the cross-shaped free layer 11 in the X and Y-directions can be matched with those of the pinned layer 13 having the tetragonal shape in the X and Y-directions.

According to this modification, since the cross-shaped free layer 11 and tetragonal pinned layer 13 can be formed in a self-matching manner, a problem of a fluctuation of the leak magnetic field between the MTJ elements by a positional deviation can be solved, and enhancement of yield can be realized.

Figure 19:
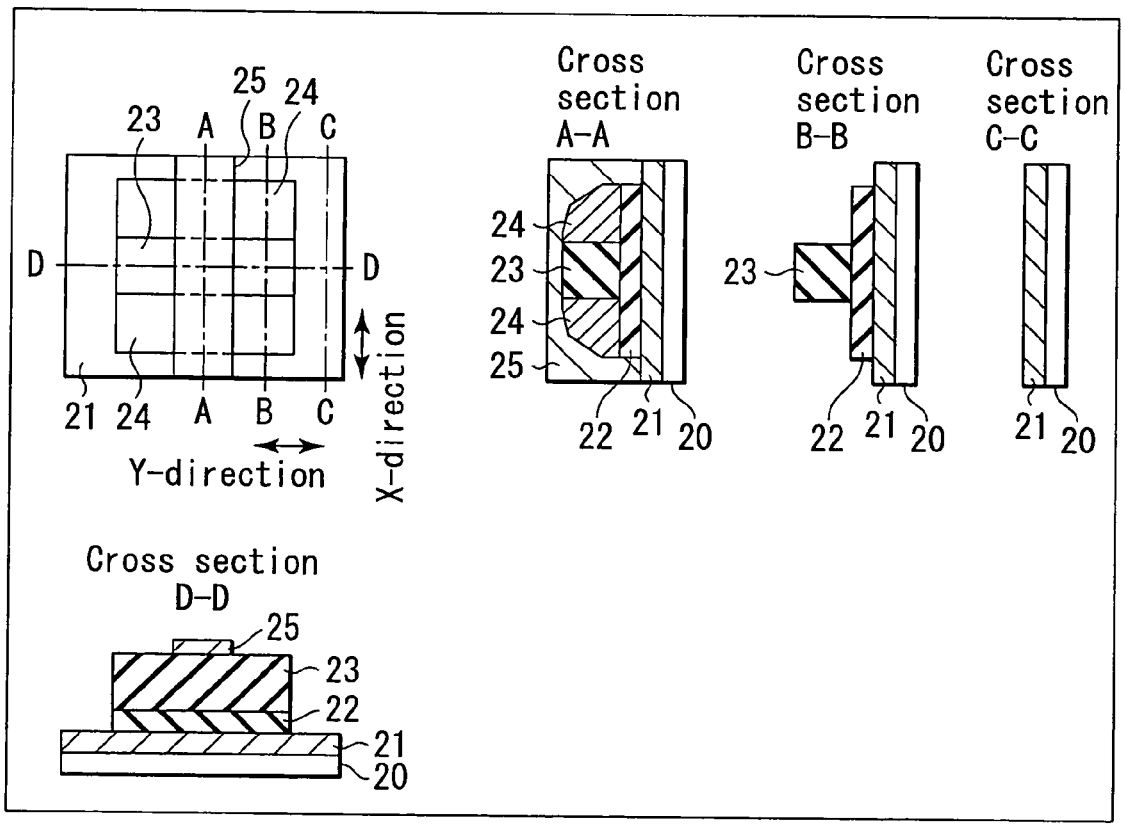
FIG. 19 is a diagram showing a step of Manufacturing Method 1 according to the example of the present invention.

Next, as shown in FIG. 19, the amorphous silicon layers 24, 25 are isotropically etched by chemical dry etching (CDE) to reduce widths of the linear amorphous silicon layers 24, 25 extending in the X-direction (recess etching).

Figure 20:
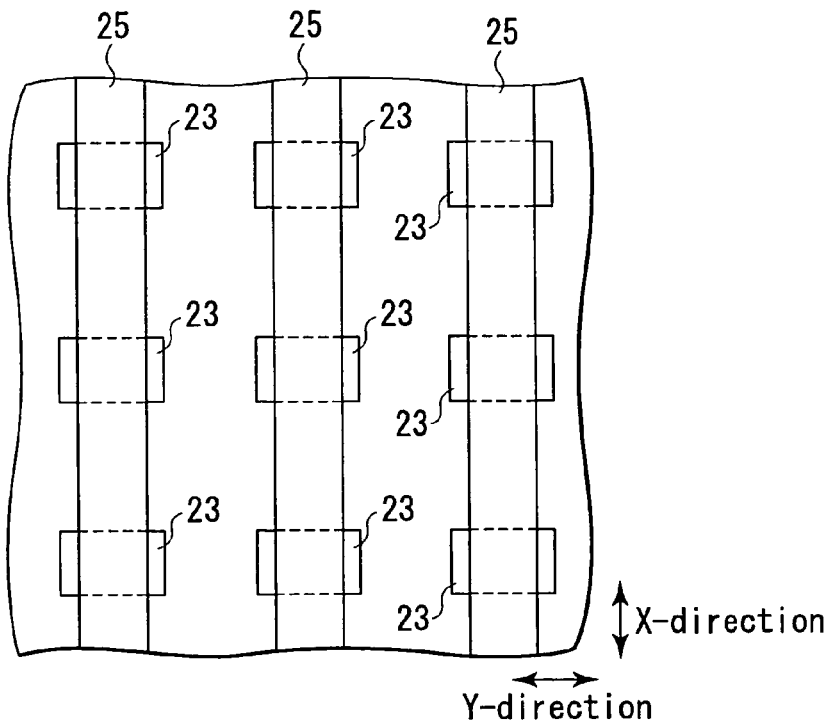
FIG. 20 is a diagram showing a step of Manufacturing Method 1 according to the example of the present invention.

It is to be noted that FIG. 20 shows the patterns of the second insulating layer 23 and amorphous silicon layer 25 at a time when the process of FIG. 19 is ended in such a manner that the pattern is easily seen.

Figure 21:
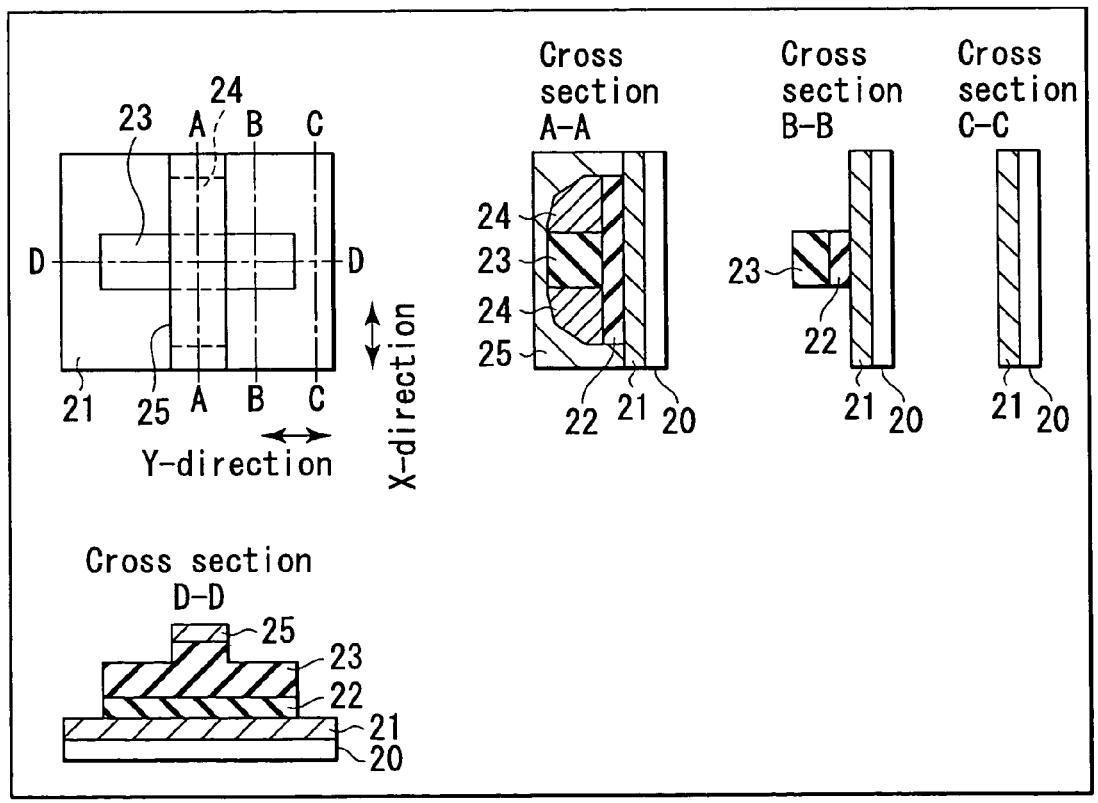
FIG. 21 is a diagram showing a step of Manufacturing Method 1 according to the example of the present invention.

Next, as shown in FIG. 21, when the first insulating layer 22 is etched by the RIE using the amorphous silicon layers 24, 25 as a mask, the first insulating layer 22 having the cross shape is formed. At this time, a part of the second insulating layer 23 and a part of the amorphous silicon layer 25 are also simultaneously etched a little.

Here, when an etching selection ratio of the first and second insulating layers 22, 23 is sufficiently secured, the etching of the second insulating layer 23 is minimized.

Figure 22:
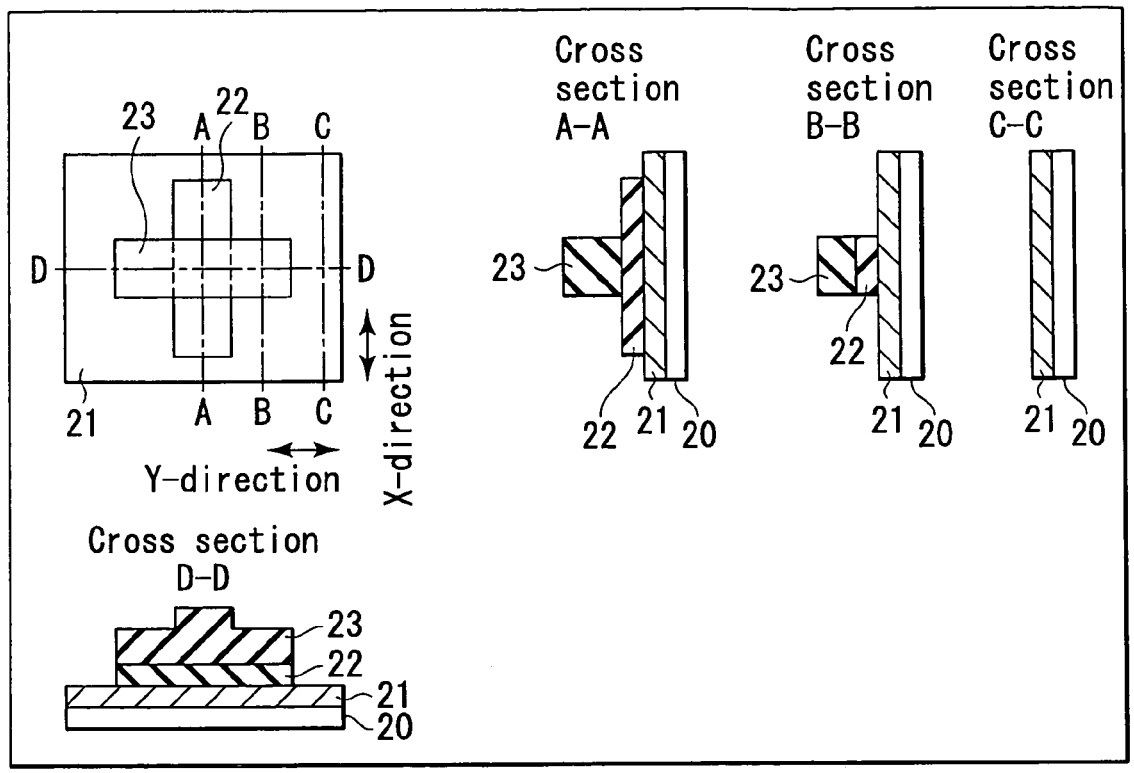
FIG. 22 is a diagram showing a step of Manufacturing Method 1 according to the example of the present invention.

Next, as shown in FIG. 22, when the amorphous silicon layers 24, 25 are removed, a "cross type" mask is formed by the first and second insulating layers 22, 23.

Figure 23:
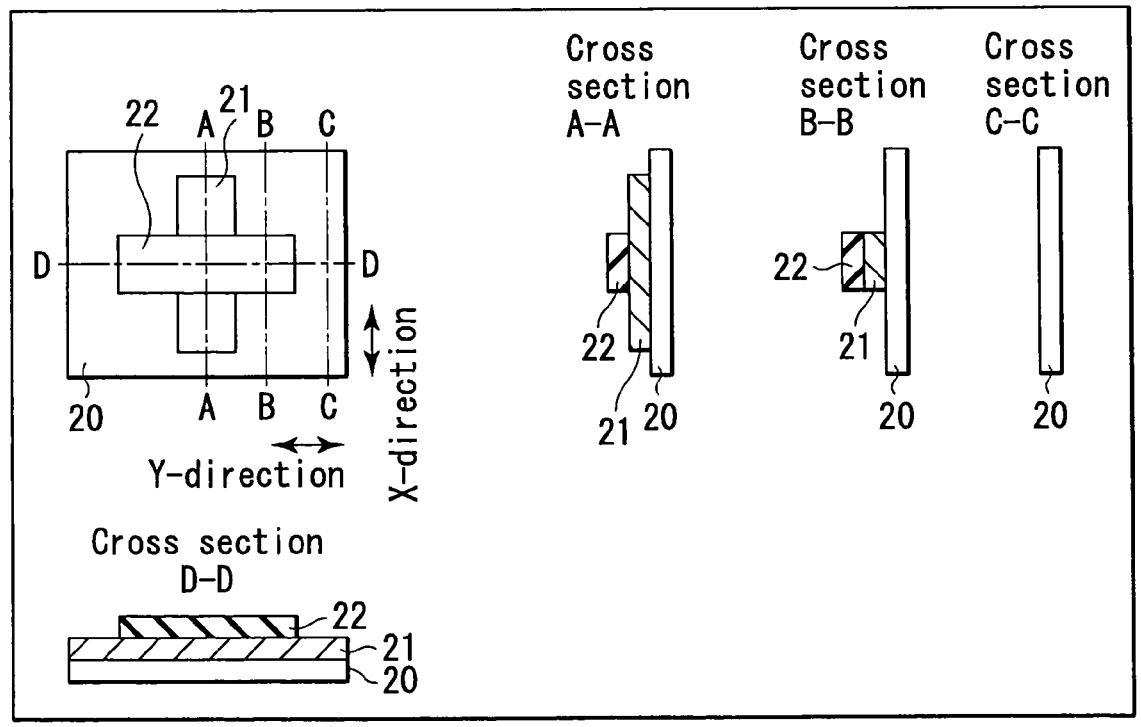
FIG. 23 is a diagram showing a step of Manufacturing Method 1 according to the example of the present invention.

Next, as shown in FIG. 23, for example, the metal layer 21, and first and second insulating layers 22, 23 are etched by argon ion milling. At this time, since the first and second insulating layers 22, 23 fulfill a role of the mask, the shapes (cross shapes) of these insulating layers are transferred to the metal layer 21.

Moreover, in the etching, for example, an etching time or the like is adjusted, the second insulating layer 23 is removed, and the first insulating layer 22 having the tetragonal shape (rectangular shape long in the Y-direction) is left.

That is, only the cross-shaped metal layer 21 and tetragonal first insulating layer 22 are left on the laminate layer 20 forming the MTJ element at this time.

Moreover, at the time of the ending of this process, a. the cross-shaped metal layer 21 and first insulating layer 22 and the tetragonal second insulating layer 23 may also be left, or b. the cross-shaped metal layer 21 and tetragonal first and second insulating layers 22, 23 may also be left.

A reason why the tetragonal first and second insulating layers 22, 23 are left is that the pinned layer or the contact pillar is formed in a "tetragonal shape" in the subsequent process.

Therefore, when the shape of the pinned layer or the contact pillar is formed in the "cross type" in the same manner as in the MTJ element, a. only the cross-shaped metal layer 21, b. the cross-shaped metal layer 21 and first insulating layer 22, or c. the cross-shaped metal layer 21, first and second insulating layers 22, 23 may also be left.

Figure 24:
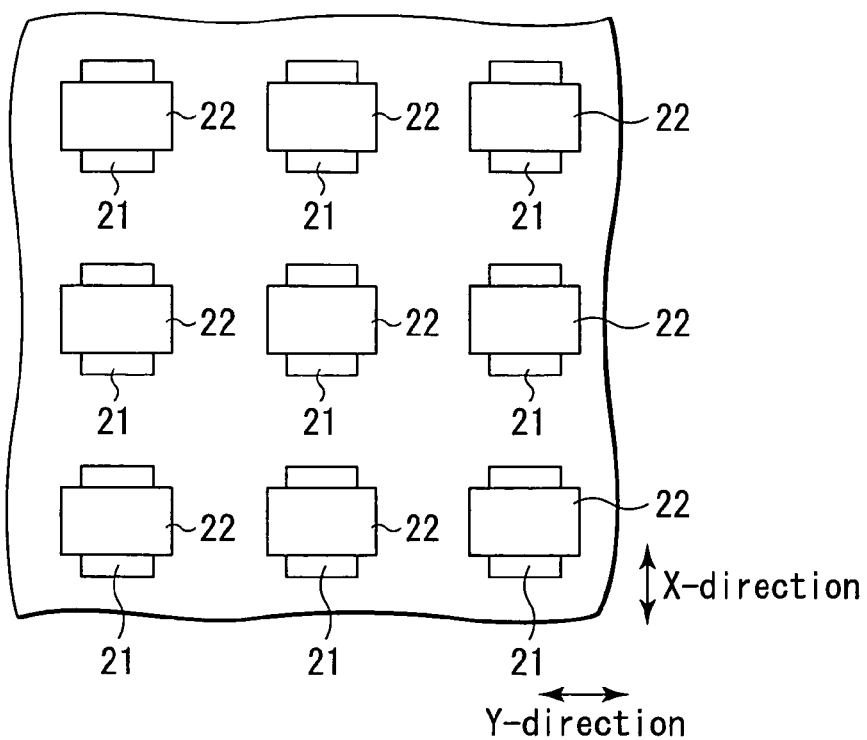
FIG. 24 is a diagram showing a step of Manufacturing Method 1 according to the example of the present invention.

It is to be noted that FIG. 24 plainly shows the patterns of the metal layer 21 and first insulating layer 22 at the time of the ending of the process of FIG. 23.

The subsequent process differs with a case where the MTJ element (MTJ[A], MTJ[B]) shown in FIG. 2 or 3 is formed and a case where the MTJ element (MTJ[C]) shown in FIG. 5 is formed.

In the following process, it is assumed that the laminate layer 20 comprises the free layer 11, tunnel insulating layer 12, and pinned layer 13.

1. Case of MTJ Element MTJ[A], MTJ[B]

Figure 25:
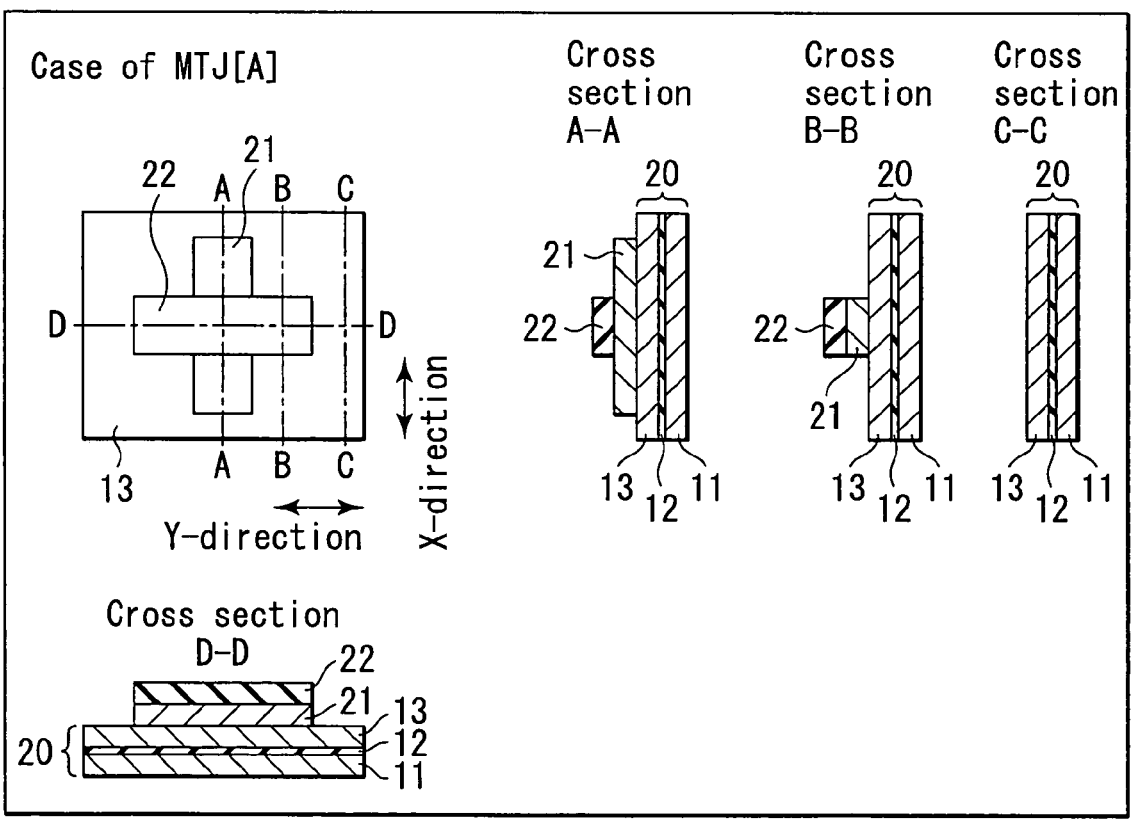
FIG. 25 is a diagram showing a step of Manufacturing Method 1 according to the example of the present invention.
Figure 26:
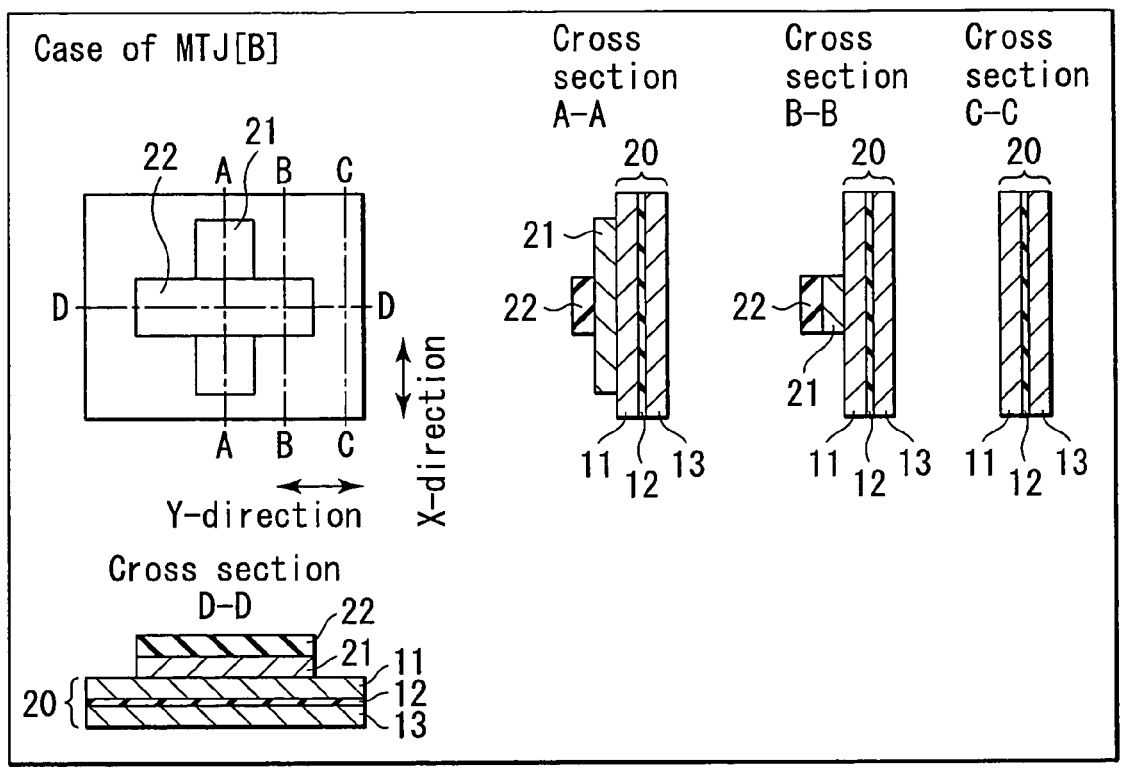
FIG. 26 is a diagram showing a step of Manufacturing Method 1 according to the example of the present invention.

As shown in FIG. 25 or 26, it is assumed that the cross-shaped metal layer 21 and the tetragonal first insulating layer 22 remain on the laminate layer 20 at the time of the ending of the process of FIG. 23.

Figure 27:
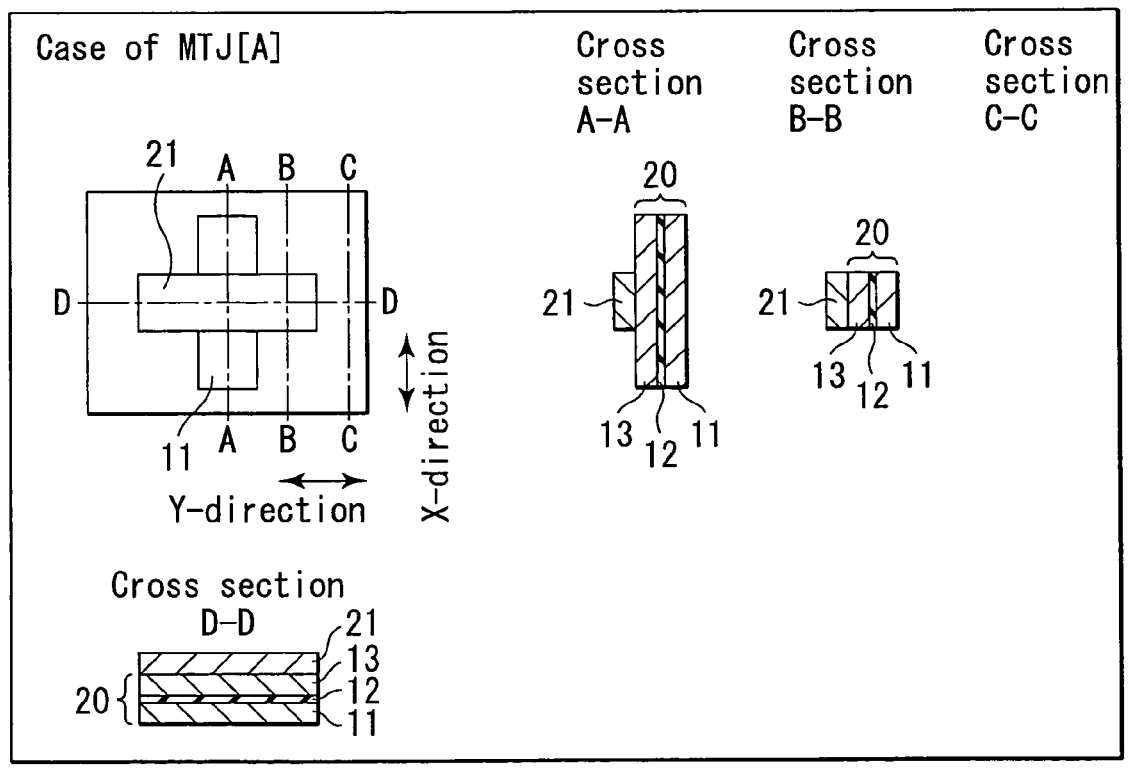
FIG. 27 is a diagram showing a step of Manufacturing Method 1 according to the example of the present invention.
Figure 28:
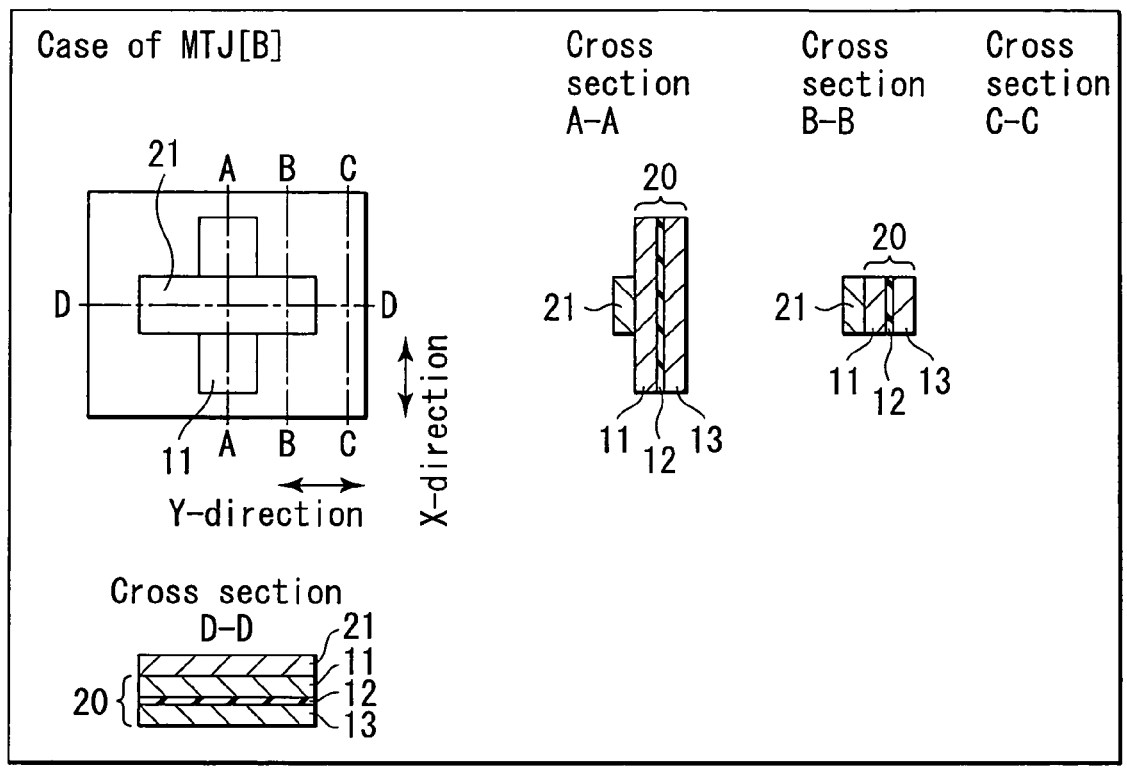
FIG. 28 is a diagram showing a step of Manufacturing Method 1 according to the example of the present invention.

In this case, as shown in FIG. 27 or 28, when the laminate layer 20, metal layer 21, and first insulating layer 22 are etched, for example, by the argon ion milling, the metal layer 21 and first insulating layer 22 fulfill the role of the mask, and therefore the cross-shaped MTJ element is formed.

That is, the cross-shaped free layer 11, tunnel insulating layer 12, and pinned layer 13 are formed by the etching.

Here, the tetragonal contact pillar (metal layer) 21 is simultaneously formed on the cross-shaped MTJ element (laminate layer) 20. In the present example, this contact pillar 21 has a rectangular shape long in the Y-direction.

Therefore, afterwards, a yoked write line is formed on the contact pillar 21, but at this time, for example, the device structure of FIGS. 8 to 10 can be easily formed.

2. Case of MTJ Element MTJ[C]

Figure 29:
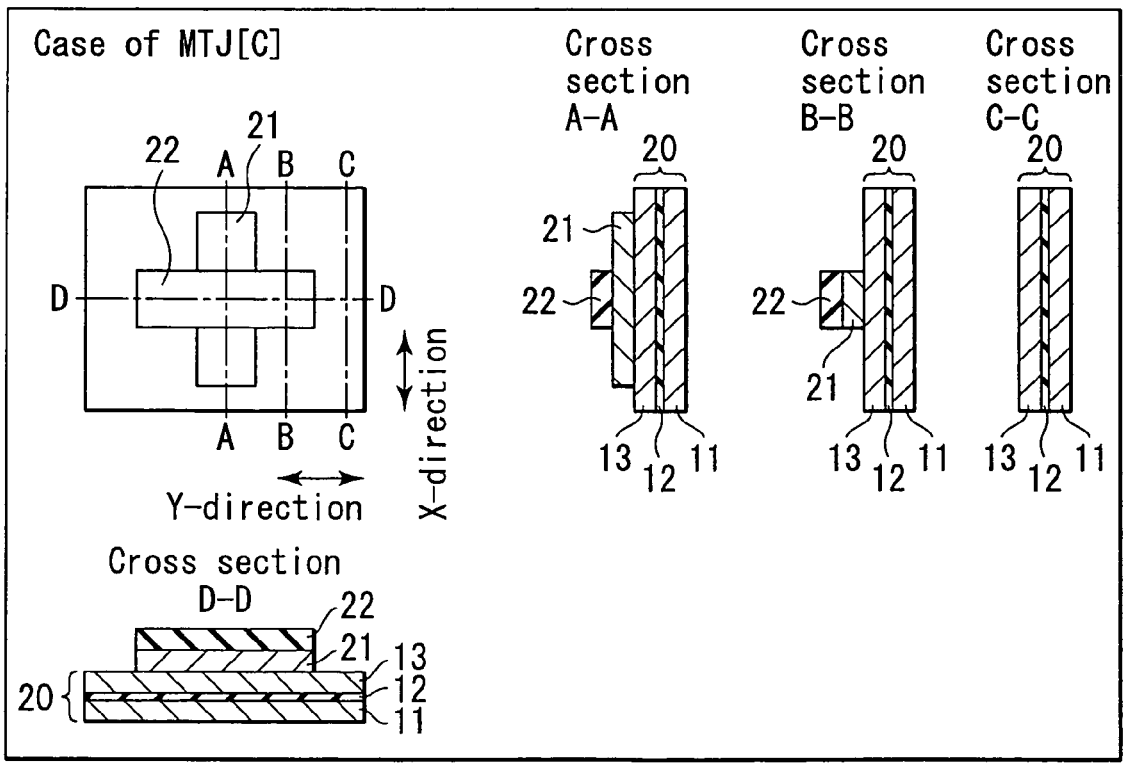
FIG. 29 is a diagram showing a step of Manufacturing Method 1 according to the example of the present invention.

As shown in FIG. 29, it is assumed that the cross-shaped metal layer 21 and the tetragonal first insulating layer 22 remain on the laminate layer 20 at the time of the ending of the process of FIG. 23.

Figure 30:
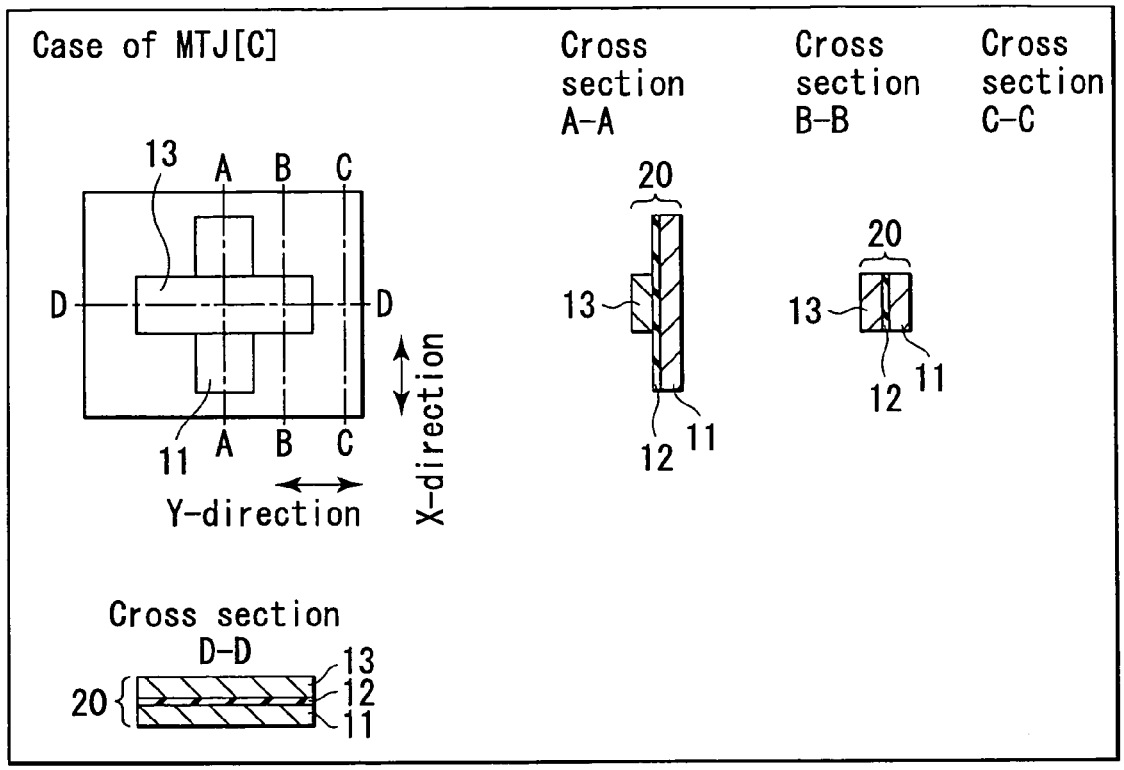
FIG. 30 is a diagram showing a step of Manufacturing Method 1 according to the example of the present invention.

In this case, as shown in FIG. 30, when the laminate layer 20, metal layer 21, and first insulating layer 22 are etched, for example, by the argon ion milling, the metal layer 21 and first insulating layer 22 fulfill the role of the mask, and therefore the cross-shaped free layer 11 and tunnel insulating layer 12, and the tetragonal pinned layer 13 are formed.

Figure 31:
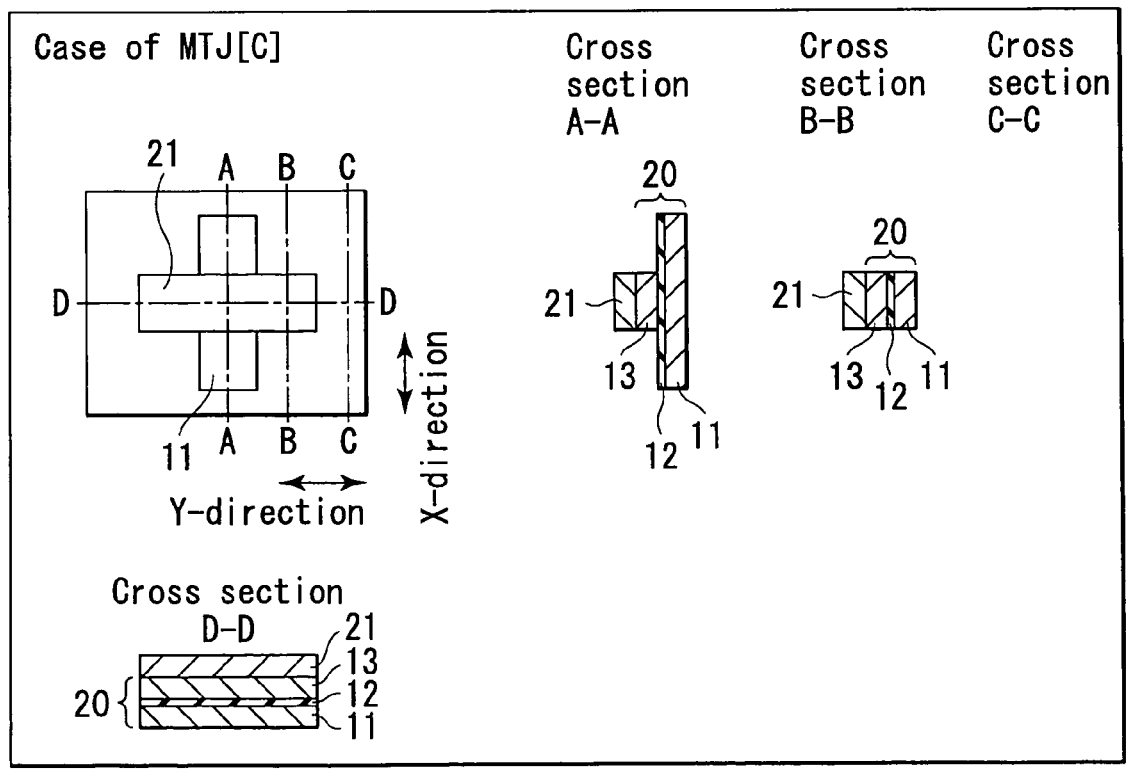
FIG. 31 is a diagram showing a step of Manufacturing Method 1 according to the example of the present invention.

Here, as shown in FIG. 31, for example, the thickness of the first insulating layer 22 in FIG. 29 or the like is adjusted, so that the tetragonal contact pillar (metal layer) 21 having the same shape as that of the pinned layer 13 may also be left on the tetragonal pinned layer 13.

Therefore, afterwards, a yoked write line is formed on the contact pillar 21, but at this time, for example, the device structure of FIGS. 11 to 13 can be easily formed.

As described above, according to Manufacturing Method 1 of the example of the present invention, the mutually intersecting line & space mask is formed by performing the photolithography twice, and the MTJ elements are formed in intersecting portions.

Moreover, since a simple line & space pattern is formed in either photolithography, a large problem is not caused by the positional deviation generated between these lithography processes.

Therefore, according to Manufacturing Method 1 of the example of the present invention, it is possible to form a cross type MTJ element having little fluctuation of the shape between the devices and having a sharp contour without using a high-resolution technique of photolithography ahead.

Especially, when both the maximum length L1 of the Y-direction and the maximum length L2 of the X-direction of the cross-shaped free layer 11 are about twice a minimum worked dimension of a lithography technique, according to the example of the present invention, when the contours of corner portions of the free layer (cross shape) 11, pinned layer (tetragonal or cross shape) 13, and contact pillar (tetragonal shape) 21 are approximated using a curve having a curvature of 1/R, a value of "R" can be 20% or less of L1 or L2.

In this case, the magnetic characteristics of the free layer of the MTJ element are improved, and the resistance to disturbance is largely enhanced. It is to be noted that Manufacturing Method 1 is applicable not only to the MTJ element but also broadly to a device having a cross shape.

(2) Manufacturing Method 2

Manufacturing Method 2 relates to a method of manufacturing a cross type MTJ element having the bottom pin structure.

Figure 32:
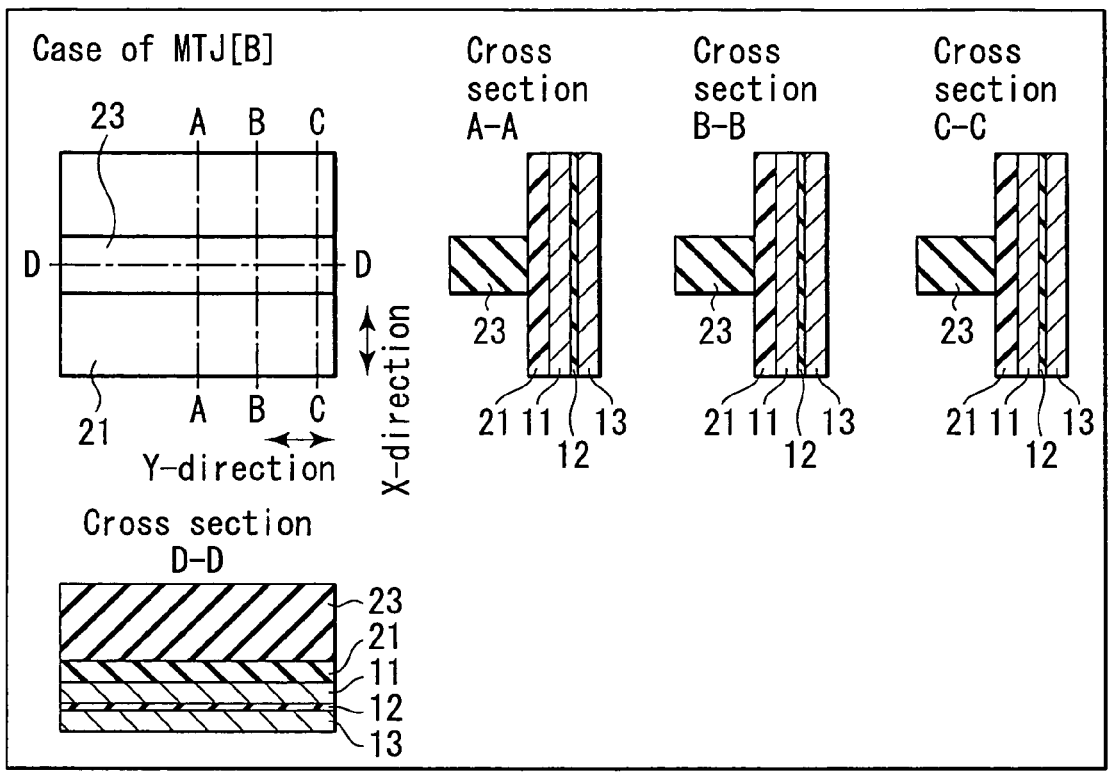
FIG. 32 is a diagram showing a step of Manufacturing Method 2 according to the example of the present invention.

First, as shown in FIG. 32, a ferromagnetic layer forming the pinned layer 13, a nonmagnetic layer forming the tunnel insulating layer 12, and a ferromagnetic layer forming the free layer 11 are formed. Subsequently, for example, the metal layer 21 is formed of aluminum on the ferromagnetic layer forming the free layer 11, and further the insulating layer 23 is formed on the metal layer 21.

Here, a cap layer (e.g., Ru) may also be disposed between the free layer 11 and the metal layer 21. When the cap layer is disposed, the cap layer is worked simultaneously with the free layer 11, and has the same shape as that of the free layer 11. The cap layer is used for preventing the free layer 11 from being deteriorated at the working time.

The first photolithography is performed to form a photo mask (resist) of line & space extending in the Y-direction. The insulating layer 23 is etched using the photo mask as a mask to form a linear insulating layer 23 extending in the Y-direction. Thereafter, for example, the photo mask is removed by the ashing.

Figure 33:
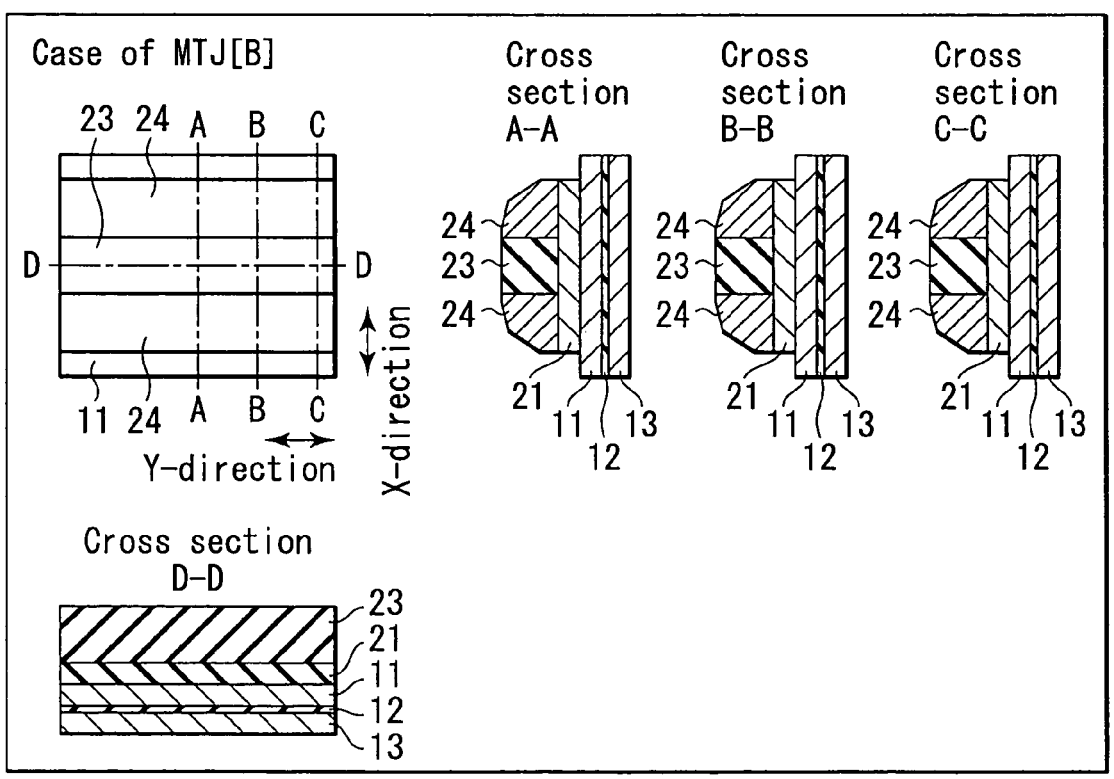
FIG. 33 is a diagram showing a step of Manufacturing Method 2 according to the example of the present invention.

Next, as shown in FIG. 33, the amorphous silicon layer 24 is formed, and this amorphous silicon layer 24 is etched by the RIE. As a result, the side wall comprising the amorphous silicon layer 24 is formed on the side wall of the insulating layer 23.

Subsequently, the metal layer 21 is etched using the insulating layer 23 and amorphous silicon layer 24 as the mask by the RIE. As a result, the metal layer 21 remains only right under the side wall comprising the insulating layer 23 and amorphous silicon layer 24.

Figure 34:
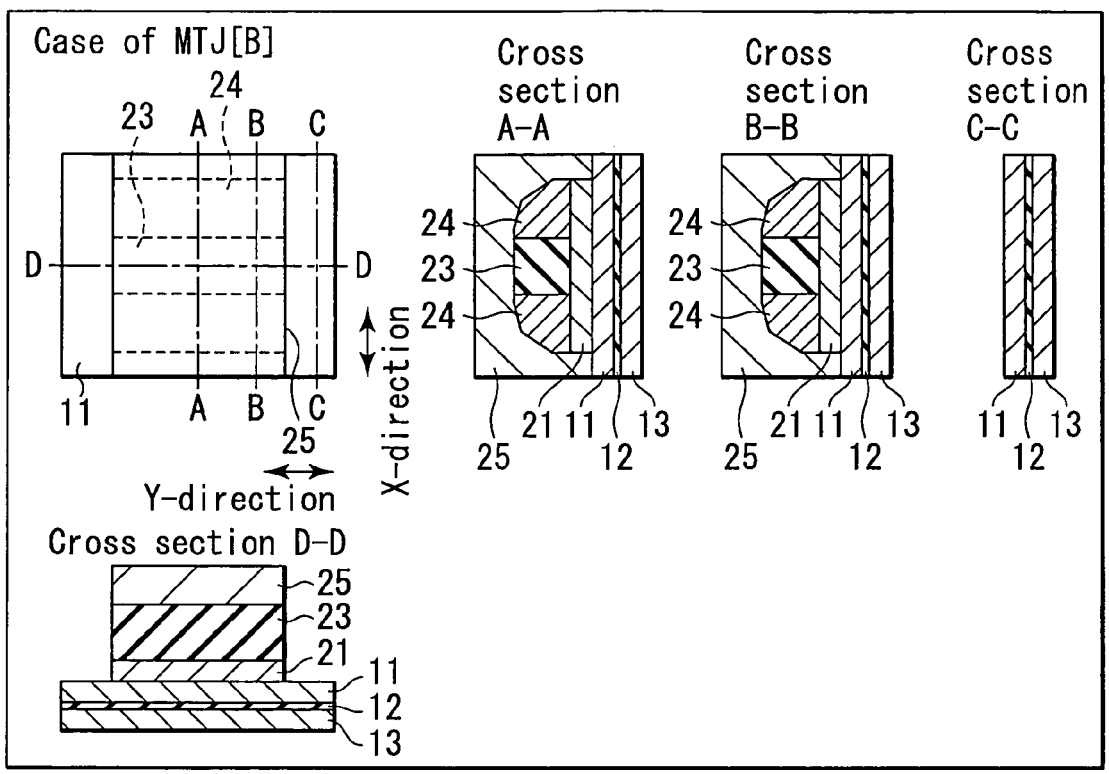
FIG. 34 is a diagram showing a step of Manufacturing Method 2 according to the example of the present invention.

Next, as shown in FIG. 34, the amorphous silicon layer 25 is formed again.

Moreover, the second photolithography is performed to form the photo mask (resist) of the line & space extending in the X-direction. The metal layer 21, insulating layer 23, and amorphous silicon layers 24, 25 are etched using the photo mask as a mask. As a result, linear amorphous silicon layers 24, 25 extending in the X-direction are formed. Thereafter, the photo mask is removed, for example, by the ashing.

Figure 35:
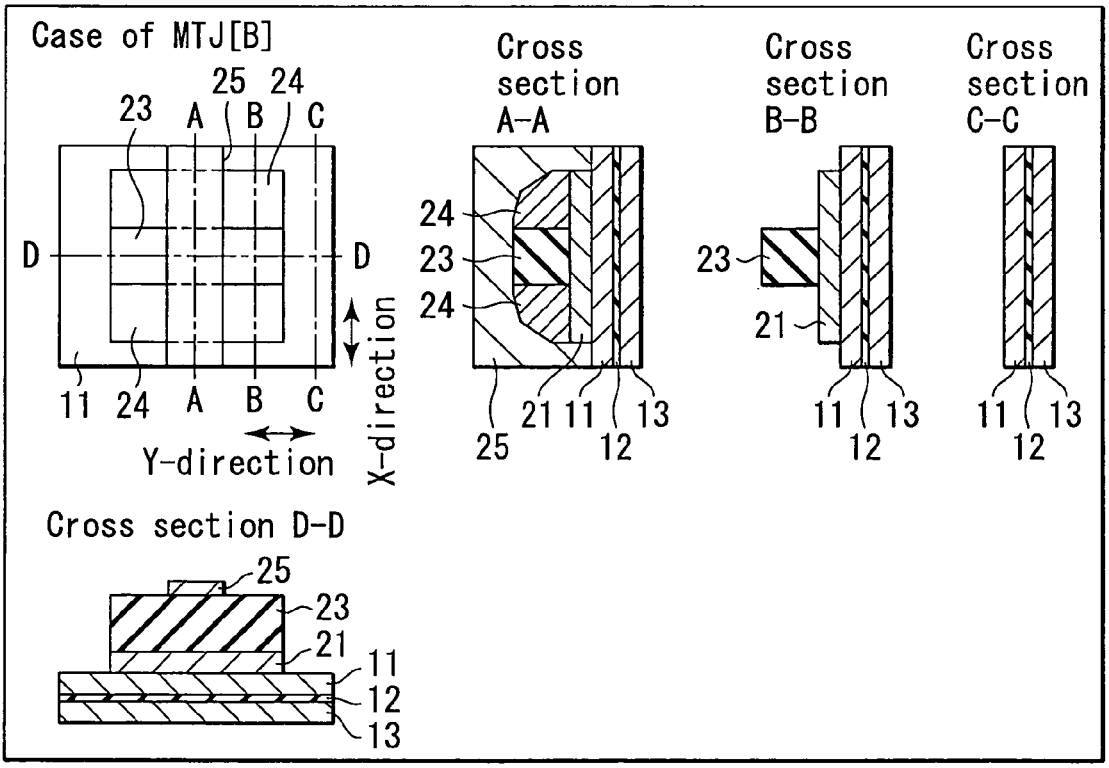
FIG. 35 is a diagram showing a step of Manufacturing Method 2 according to the example of the present invention.

Next, as shown in FIG. 35, the amorphous silicon layers 24, 25 are isotropically etched by the chemical dry etching (CDE) to reduce the widths of the linear amorphous silicon layers 24, 25 extending in the X-direction (recess etching).

Figure 36:
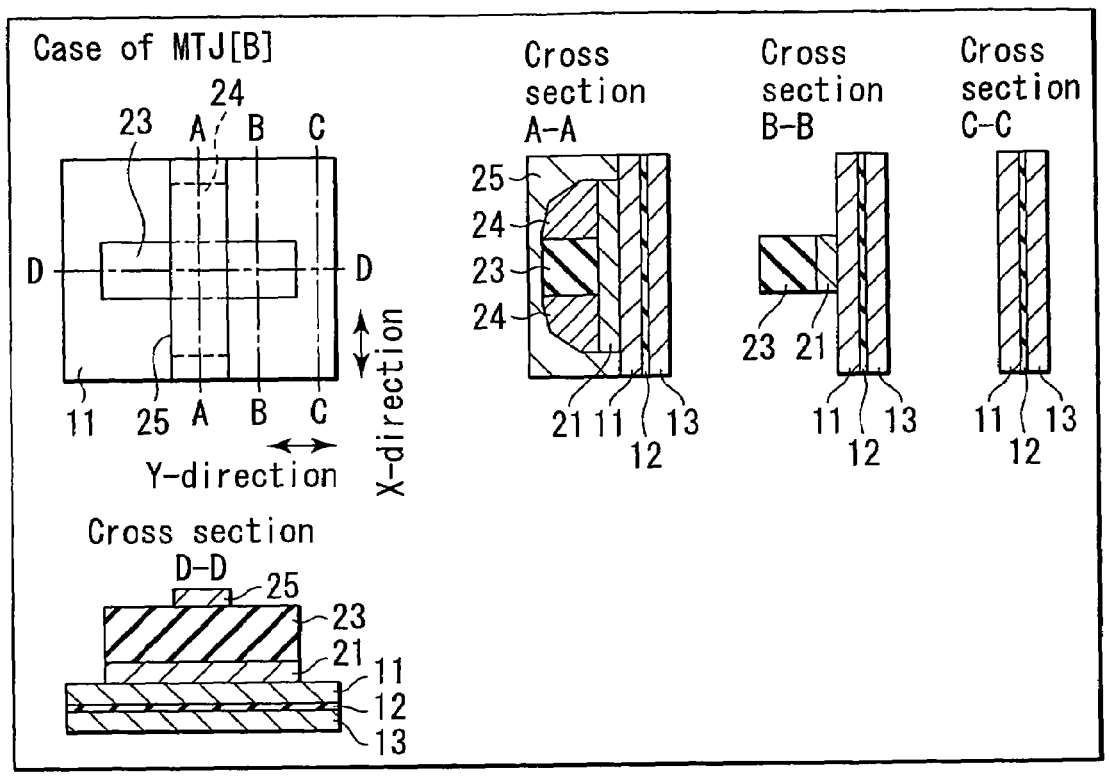
FIG. 36 is a diagram showing a step of Manufacturing Method 2 according to the example of the present invention.

Next, as shown in FIG. 36, when the metal layer 21 is etched by the RIE using the amorphous silicon layers 24, 25 as a mask, the cross-shaped metal layer 21 is formed.

Figure 37:
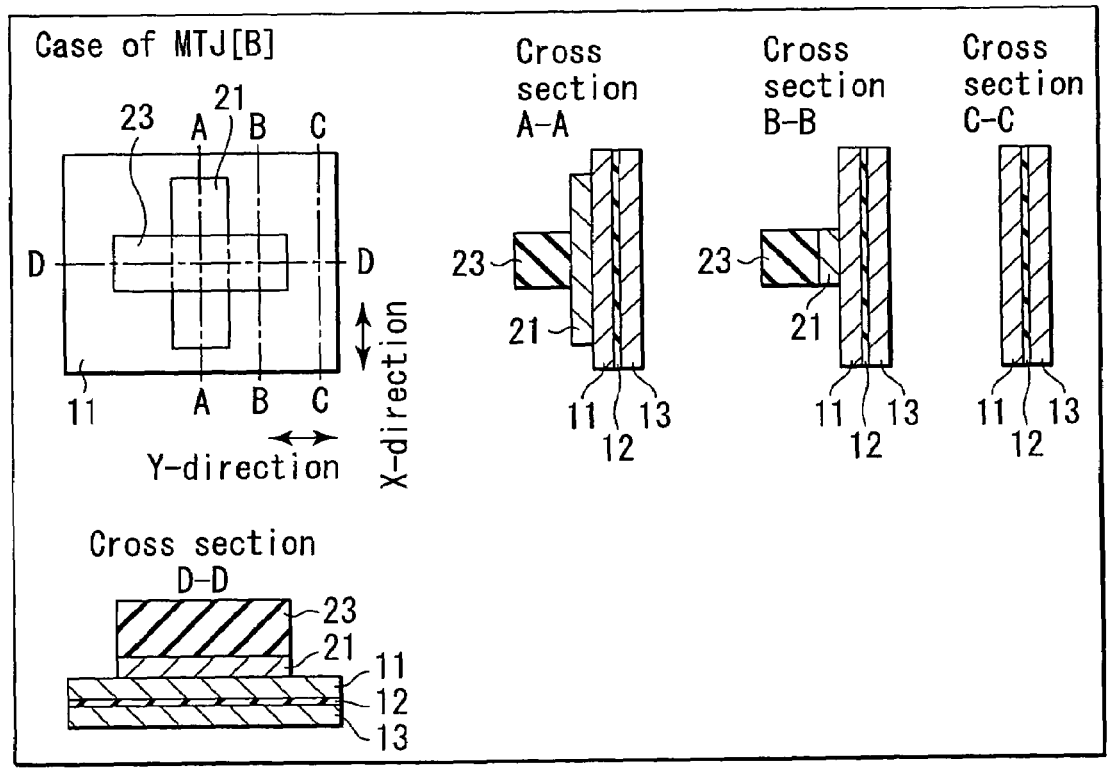
FIG. 37 is a diagram showing a step of Manufacturing Method 2 according to the example of the present invention.

Next, as shown in FIG. 37, the amorphous silicon layers 24, 25 are removed. Then, the mask comprising the cross-shaped metal layer 21 and the tetragonal second insulating layer 23 is formed on an upper part of the free layer 11, tunnel insulating layer 12, and pinned layer 13 forming the MTJ element.

Figure 38:
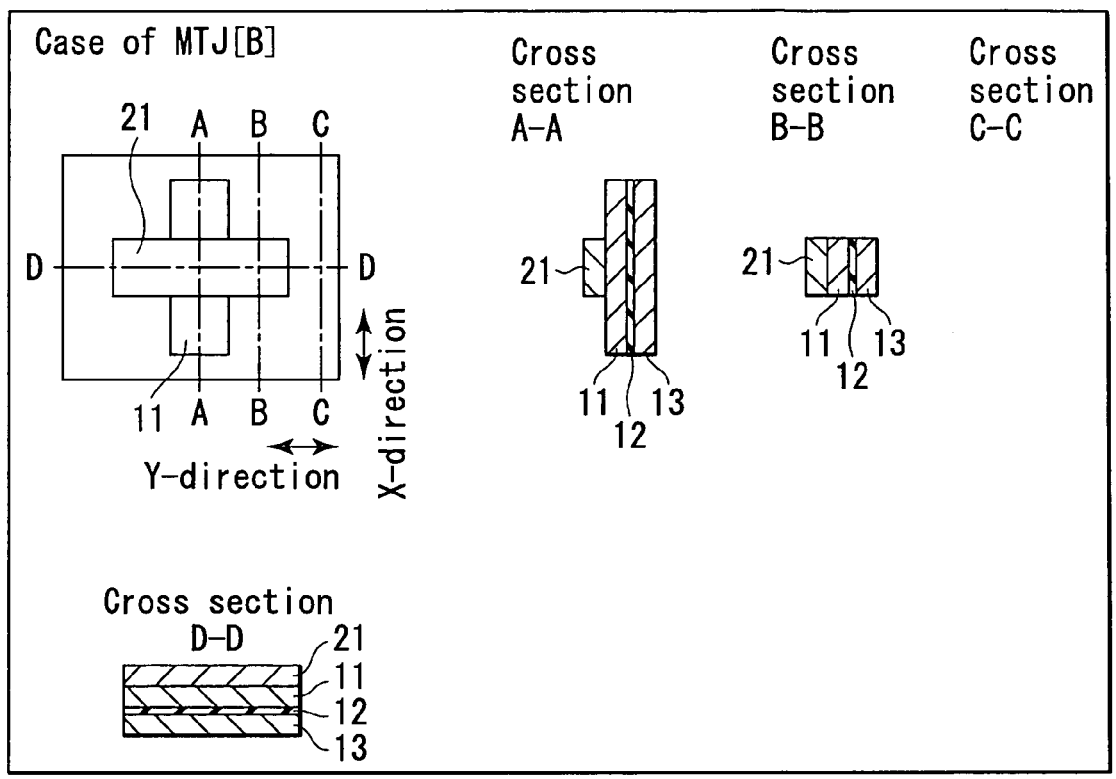
FIG. 38 is a diagram showing a step of Manufacturing Method 2 according to the example of the present invention.

Next, when the free layer 11, tunnel insulating layer 12, pinned layer 13, metal layer 21, and insulating layer 23 are etched, for example, by the argon ion milling as shown in FIG. 38, the metal layer 21 and the insulating layer 23 fulfill the role of the mask, and therefore the shape (cross shape) of the metal layer 21 is transferred to the free layer 11, tunnel insulating layer 12, and pinned layer 13.

Here, this etching process may also be performed on a condition that the pinned layer 13 is not etched. That is, when the pinned layer 13 is individually patterned in a process before/after the etching process, the tetragonal pinned layer 13 can be obtained.

Moreover, in this etching process, the cross-shaped MTJ element is obtained, and further the tetragonal metal layer (contact pillar) 21 is obtained on the MTJ element. That is, for the metal layer 21, the insulating layer 23 fulfills the role of the mask, and therefore the shape (tetragonal shape) of the insulating layer 23 is transferred to the metal layer 21.

Therefore, the yoked write line is thereafter formed on the contact pillar 21, but at this time, for example, the device structure of FIGS. 8 to 10 can be easily formed.

As described above, also in Manufacturing Method 2 according to the example of the present invention, the mutually intersecting line & space mask is formed by performing the photolithography twice, and the MTJ elements are formed in the intersecting portions.

Moreover, since the simple line & space pattern is formed in either photolithography, a large problem is not caused by the positional deviation generated between these lithography processes.

Therefore, according to Manufacturing Method 2 of the example of the present invention, it is possible to form the cross type MTJ element having little fluctuation of the shape between the devices and having the sharp contour without using the high-resolution technique of photolithography ahead.

Especially, when both the maximum length L1 of the Y-direction and the maximum length L2 of the X-direction of the cross-shaped free layer 11 are about twice the minimum worked dimension of the lithography technique, according to the example of the present invention, when the contours of the corner portions of the free layer (cross shape) 11, pinned layer (tetragonal or cross shape) 13, and contact pillar (tetragonal shape) 21 are approximated using the curve having a curvature of 1/R, the value of "R" can be 20% or less of L1 or L2.

In this case, the magnetic characteristics of the free layer of the MTJ element are improved, and the resistance to disturbance is largely enhanced. It is to be noted that Manufacturing Method 1 is also applicable not only to the MTJ element but also broadly to the device having a cross shape.

(3) Manufacturing Method 3

Manufacturing Method 3 relates to a method of manufacturing a cross type MTJ element having the top pin structure.

Figure 39:
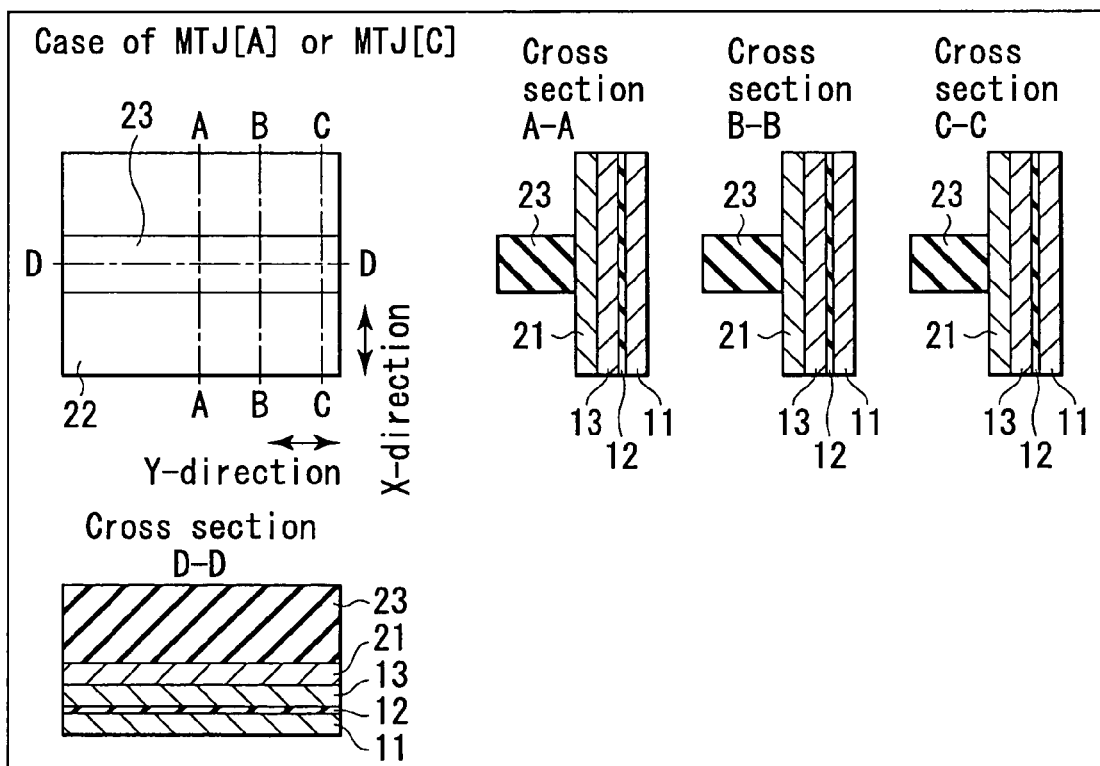
FIG. 39 is a diagram showing a step of Manufacturing Method 3 according to the example of the present invention.

First, as shown in FIG. 39, a ferromagnetic layer forming the free layer 11, a nonmagnetic layer forming the tunnel insulating layer 12, and a ferromagnetic layer forming the pinned layer 13 are formed. Subsequently, for example, the metal layer 21 is formed of aluminum on the ferromagnetic layer forming the pinned layer 13, and further the insulating layer 23 is formed on the metal layer 21.

Here, a cap layer (e.g., Ru) may also be disposed between the pinned layer 13 and the metal layer 21. When the cap layer is disposed, the cap layer is worked simultaneously with the pinned layer 13, and has the same shape as that of the pinned layer 13. The cap layer is used for preventing the pinned layer 13 from being deteriorated at the working time.

The first photolithography is performed to form the photo mask (resist) of line & space extending in the Y-direction. The insulating layer 23 is etched using the photo mask as a mask to form the linear insulating layer 23 extending in the Y-direction. Thereafter, for example, the photo mask is removed by the ashing.

Figure 40:
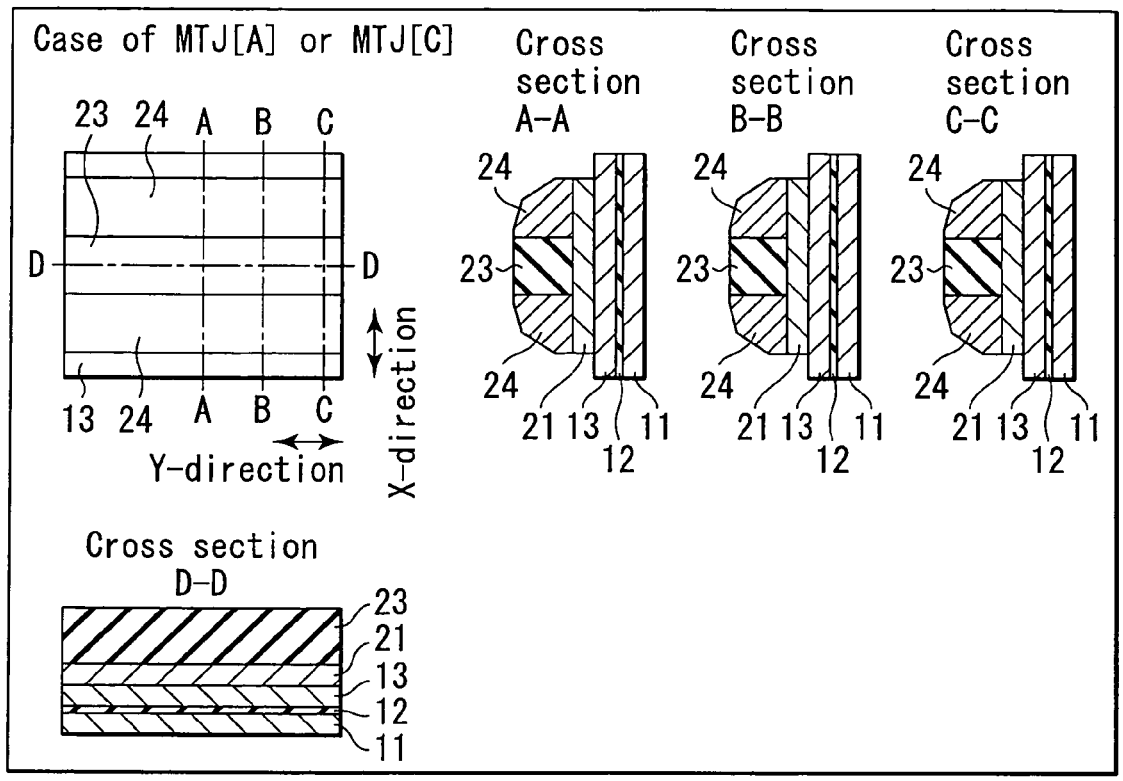
FIG. 40 is a diagram showing a step of Manufacturing Method 3 according to the example of the present invention.

Next, as shown in FIG. 40, the amorphous silicon layer 24 is formed, and this amorphous silicon layer 24 is etched by the RIE. As a result, the side wall comprising the amorphous silicon layer 24 is formed on the side wall of the insulating layer 23.

Subsequently, the metal layer 21 is etched using the insulating layer 23 and amorphous silicon layer 24 as the mask by the RIE. As a result, the metal layer 21 remains only right under the side wall comprising the insulating layer 23 and amorphous silicon layer 24.

Figure 41:
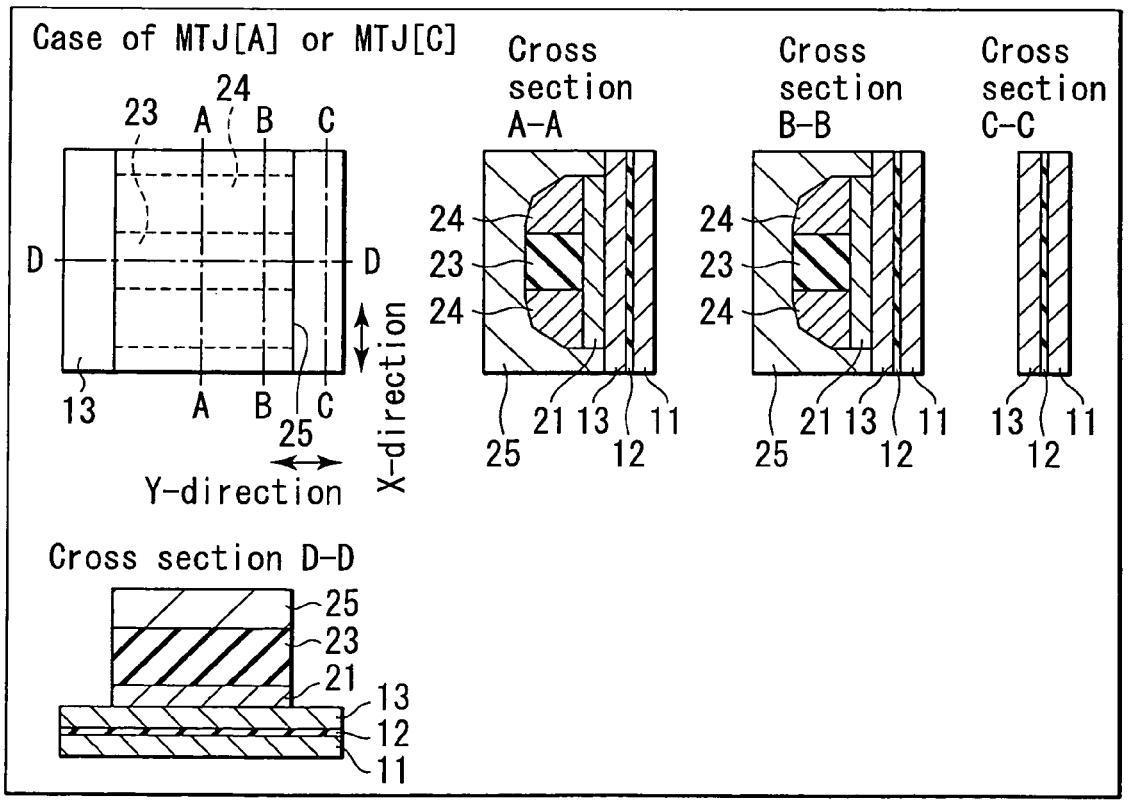
FIG. 41 is a diagram showing a step of Manufacturing Method 3 according to the example of the present invention.

Next, as shown in FIG. 41, the amorphous silicon layer 25 is formed again.

Moreover, the second photolithography is performed to form the photo mask (resist) of the line & space extending in the X-direction. The metal layer 21, insulating layer 23, and amorphous silicon layers 24, 25 are etched using the photo mask as a mask. As a result, the linear amorphous silicon layers 24, 25 extending in the X-direction are formed. Thereafter, the photo mask is removed, for example, by the ashing.

Figure 42:
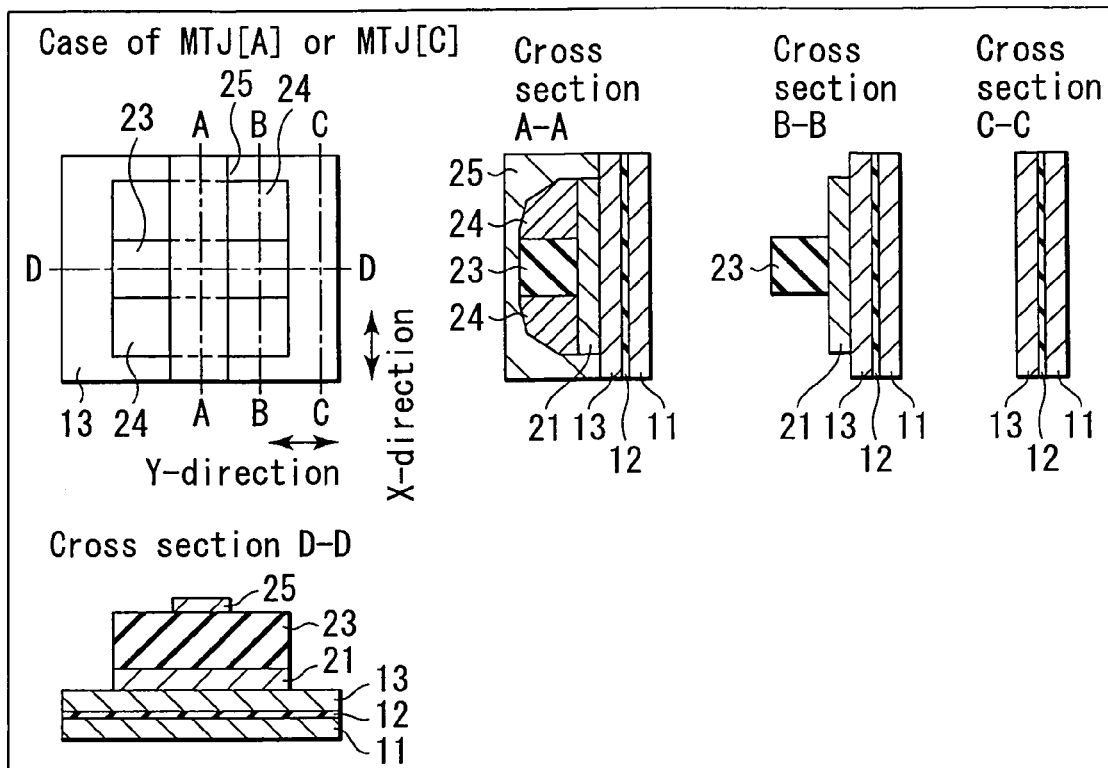
FIG. 42 is a diagram showing a step of Manufacturing Method 3 according to the example of the present invention.

Next, as shown in FIG. 42, the amorphous silicon layers 24, 25 are isotropically etched by the chemical dry etching (CDE) to reduce the widths of the linear amorphous silicon layers 24, 25 extending in the X-direction (recess etching).

Figure 43:
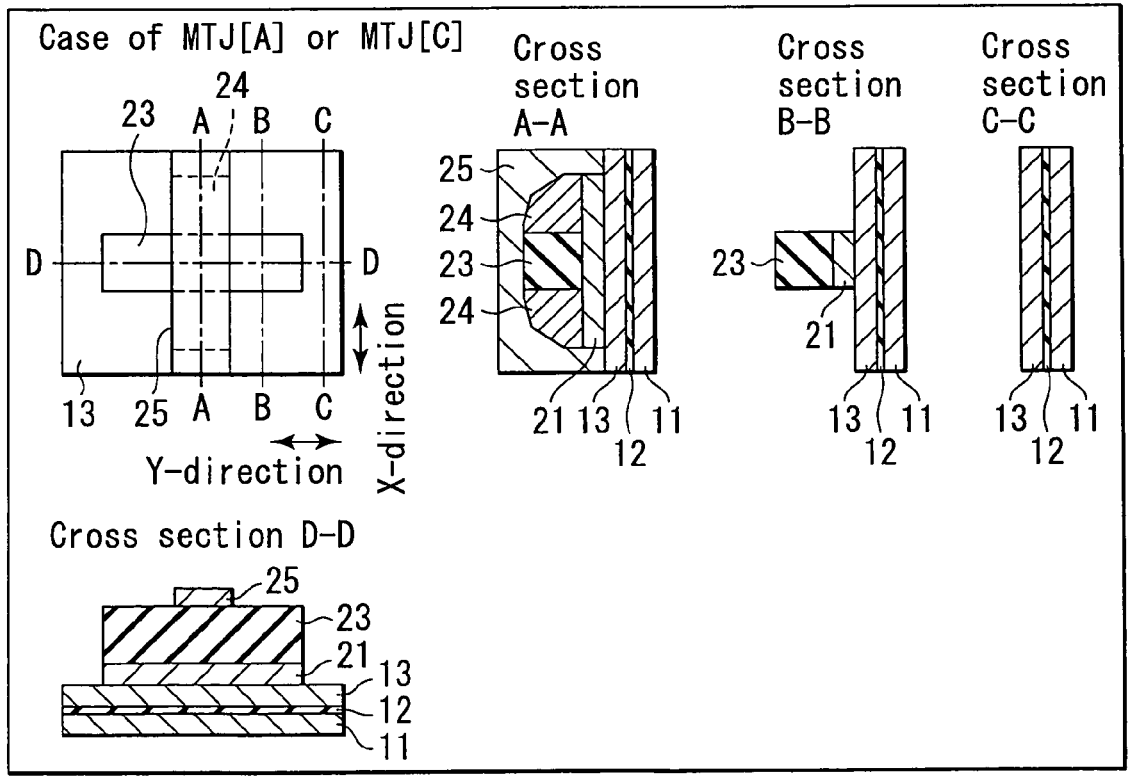
FIG. 43 is a diagram showing a step of Manufacturing Method 3 according to the example of the present invention.

Next, as shown in FIG. 43, when the metal layer 21 is etched by the RIE using the amorphous silicon layers 24, 25 as a mask, the cross-shaped metal layer 21 is formed.

Figure 44:
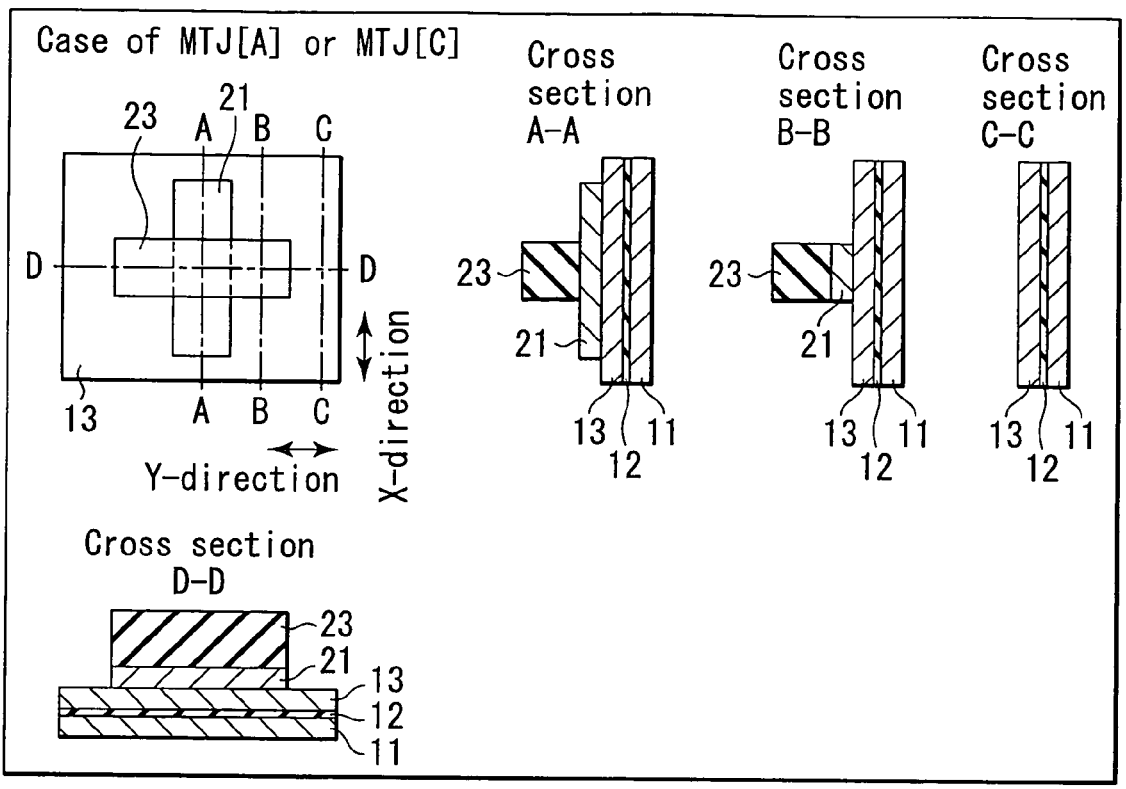
FIG. 44 is a diagram showing a step of Manufacturing Method 3 according to the example of the present invention.

Next, as shown in FIG. 44, the amorphous silicon layers 24, 25 are removed. Then, the mask comprising the cross-shaped metal layer 21 and the tetragonal second insulating layer 23 is formed on the upper part of the free layer 11, tunnel insulating layer 12, and pinned layer 13 forming the MTJ element.

Figure 45:
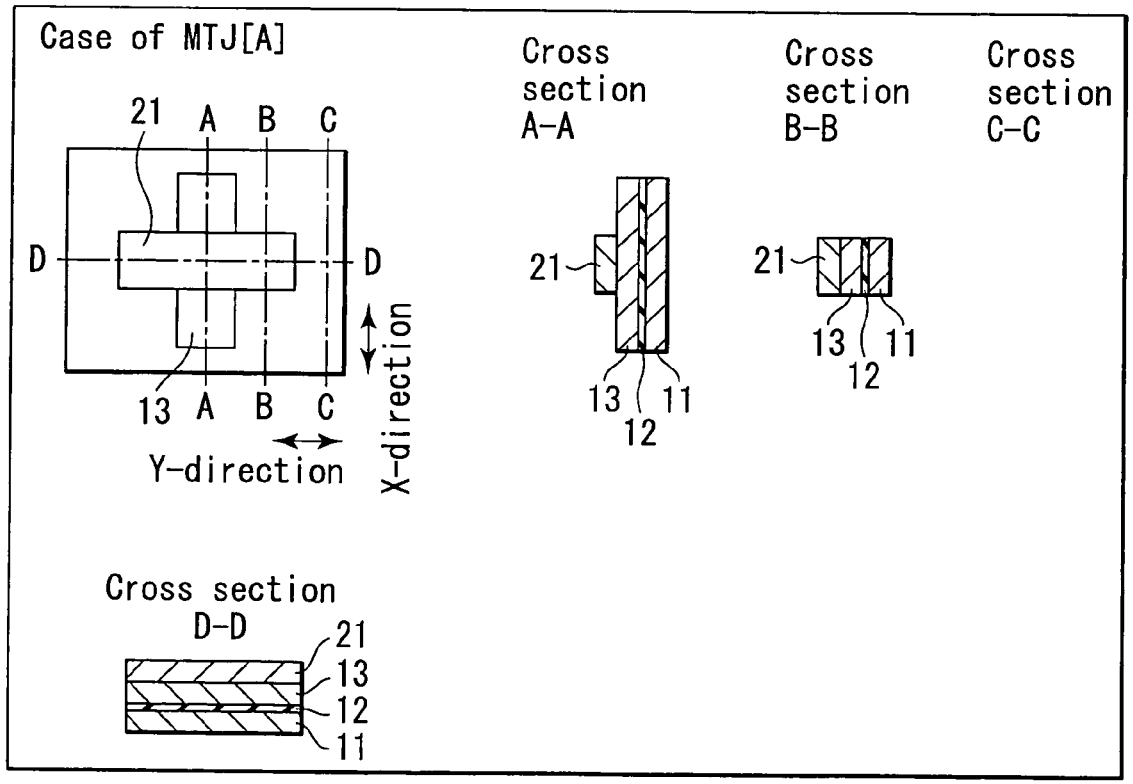
FIG. 45 is a diagram showing a step of Manufacturing Method 3 according to the example of the present invention.
Figure 46:
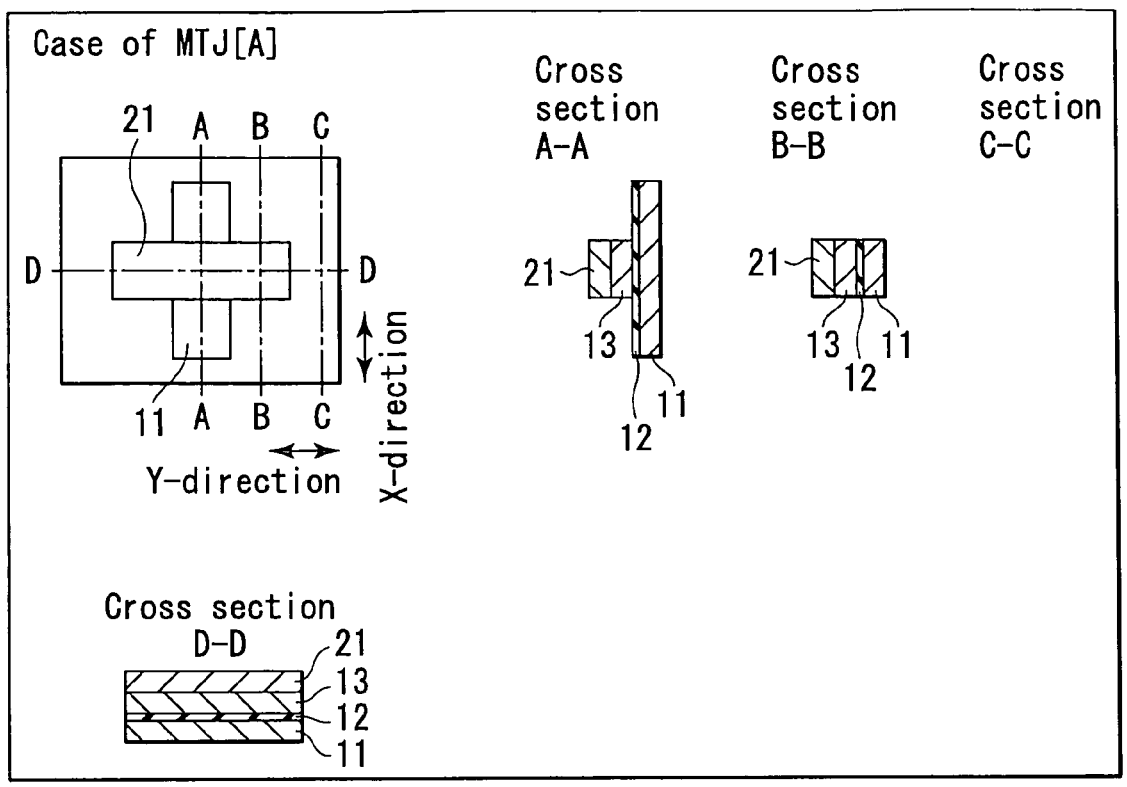
FIG. 46 is a diagram showing a step of Manufacturing Method 3 according to the example of the present invention.

Next, when the free layer 11, tunnel insulating layer 12, pinned layer 13, metal layer 21, and insulating layer 23 are etched, for example, by the argon ion milling as shown in FIGS. 45 and 46, the metal layer 21 and the insulating layer 23 fulfill the role of the mask, and therefore the shape (cross shape) of the metal layer 21 is transferred to the free layer 11, tunnel insulating layer 12, and pinned layer 13.

Moreover, in this etching process, the cross-shaped MTJ element is obtained, and further the tetragonal metal layer (contact pillar) 21 is obtained on the MTJ element. That is, for the metal layer 21, the insulating layer 23 fulfills the role of the mask, and therefore the shape (tetragonal shape) of the insulating layer 23 is transferred to the metal layer 21.

Here, the following two etching processes can be selected concerning the shape of the pinned layer 13.

In one process, the MTJ element MTJ[A] shown in FIG. 2 is formed. In this case, the shape (cross shape) of the metal layer 21 is transferred to the free layer 11, tunnel insulating layer 12, and pinned layer 13 as shown in FIG. 45, for example, by the argon ion milling, and further the shape (tetragonal shape) of the insulating layer 23 is transferred to the metal layer (contact pillar) 21.

According to this process, the pinned layer 13 has the cross shape, and the contact pillar 21 has the tetragonal shape. This process can be easily performed, when the thicknesses of the metal layer 21 and second insulating layer 23 forming the mask and the like are adjusted.

In the other process, the MTJ element MTJ[C] shown in FIG. 5 is formed. In this case, the shape (cross shape) of the metal layer 21 is transferred to the free layer 11 and tunnel insulating layer 12 as shown in FIG. 46, for example, by the argon ion milling, and further the shape (tetragonal shape) of the insulating layer 23 is transferred to the pinned layer 13 and metal layer (contact pillar) 21.

According to this process, both the pinned layer 13 and the contact pillar 21 have the tetragonal shape. This process can also be easily performed, when the thicknesses of the metal layer 21 and second insulating layer 23 forming the mask and the like are adjusted.

Therefore, the yoked write line is thereafter formed on the contact pillar 21, but at this time, the device structure of FIGS. 8 to 10 or FIGS. 11 to 13 can be easily formed.

As described above, also in Manufacturing Method 3 according to the example of the present invention, the mutually intersecting line & space mask is formed by performing the photolithography twice, and the MTJ elements are formed in the intersecting portions.

Moreover, since the simple line & space pattern is formed in either photolithography, a large problem is not caused by the positional deviation generated between these lithography processes.

Therefore, according to Manufacturing Method 3 of the example of the present invention, it is possible to form the cross type MTJ element having little fluctuation of the shape between the devices and having the sharp contour without using the high-resolution technique of photolithography ahead.

Especially, when both the maximum length L1 of the Y-direction and the maximum length L2 of the X-direction of the cross-shaped free layer 11 are about twice the minimum worked dimension of the lithography technique, according to the example of the present invention, when the contours of the corner portions of the free layer (cross shape) 11, pinned layer (tetragonal or cross shape) 13, and contact pillar (tetragonal shape) 21 are approximated using the curve having a curvature of 1/R, the value of "R" can be 20% or less of L1 or L2.

In this case, the magnetic characteristics of the free layer of the MTJ element are improved, and the resistance to disturbance is largely enhanced. It is to be noted that Manufacturing Method 3 is also applicable not only to the MTJ element but also broadly to the device having the cross shape.

6. Others

It is ideal that an MTJ element is of a complete cross type concerning the MTJ element and device structure according to the example of the present invention, but the present invention is also applicable even to a case where corner portions are rounded.

Manufacturing Methods 1, 2, 3 according to the examples of the present invention have been described in accordance with a cross type MTJ element, but the present invention is not limited to this, and Manufacturing Methods 1, 2, 3 may be applied, for example, to the forming of a minute cross shape.

Moreover, in Manufacturing Methods 1, 2, 3 according to the examples of the present invention, an amorphous silicon layer is used as a hard mask, but, for example, the amorphous silicon layer may be replaced with a resist layer to etch an insulating layer or the like using the resist layer as a mask.

According to the examples of the present invention, first a mutually intersecting line & space mask is formed by performing photolithography twice, and MTJ elements are formed in intersecting portions. Accordingly, it is possible to form a cross type MTJ element having little fluctuation of the shape between the devices and having a sharp contour without using a high-resolution technique of photolithography ahead.

Secondly, when the pinned layer is formed in a tetragonal shape (e.g., rectangular shape) in the MTJ element having a top pin structure, a leak magnetic field from the pinned layer can be reduced, and the fluctuation of the magnetic field between the MTJ elements can be eliminated. Additionally, characteristics of a magnetic layer can also be enhanced.

Thirdly, when a tetragonal contact pillar is formed to constitute a contact with a write line simultaneously with a patterning time of the MTJ element, a distance between a yoke material and a free layer can be reduced, and a write magnetic field can be efficiently added to the MTJ element.

Additional advantages and modifications will readily occur to those skilled in the art. Therefore, the invention in its broader aspects is not limited is to the specific details and representative embodiments shown and described herein. Accordingly, various modifications may be made without departing from the spirit or scope of the general invention concept as defined by the appended claims and their equivalents.

What is claimed is:

1. A magnetic resistive element comprising:
   a first magnetic layer whose magnetized state changes in accordance with data;
   a nonmagnetic layer disposed on the first magnetic layer; and
   a second magnetic layer which is disposed on the nonmagnetic layer and whose magnetized state is fixed,
   wherein the first magnetic layer has a cross shape in which a maximum length of a first direction is L1 and a maximum length of a second direction crossing the first direction at right angles is L2, and the second magnetic layer has a tetragonal shape in which the maximum length of the first direction is L3 ($\leq$L1) and the maximum length of the second direction is L4 (<L2).

2. The magneto resistive element according to claim 1, wherein contours of corner portions of the cross shape and the tetragonal shape can be approximated by a curvature radius R, and R has a value of 20% or less of L1 or L2.

3. A magneto resistive element comprising:
   a first magnetic layer whose magnetized state changes in accordance with data;
   a nonmagnetic layer disposed on the first magnetic layer; and
   a second magnetic layer which is disposed on the nonmagnetic layer and whose magnetized state is fixed,
   wherein a ratio (L1/L2) of a maximum length L1 of a first direction to a maximum length L2 of a second direction crossing the first direction at right angles in the first magnetic layer is smaller than a ratio (L3/L4) of a maximum length L3 of the first direction to a maximum length L4 of the second direction in the second magnetic layer, and L2>L4.

4. A magnetic random access memory comprising:
   a magneto resistive element comprising a first magnetic layer whose magnetized state changes in accordance with data, a second magnetic layer whose magnetized state is fixed, and a nonmagnetic layer disposed between the first and second magnetic layers;
   a conductive line disposed above the magneto resistive element; and
   a contact pillar which connects the magneto resistive element to the conductive line,
   wherein at least the first magnetic layer of the magneto resistive element has a cross shape in which a maximum length of a first direction is L1 and a maximum length of a second direction crossing the first direction at right angles is L2, and the contact pillar has a tetragonal shape in which the maximum length of the first direction is D1 ($\leq$L1) and the maximum length of the second direction is D2 (<L2).

5. The magnetic random access memory according to claim 4, wherein the nonmagnetic layer is disposed on the first magnetic layer, the second magnetic layer is disposed on the nonmagnetic layer, and both the first and second magnetic layers have a cross shape.

6. The magnetic random access memory according to claim 4, wherein the nonmagnetic layer is disposed on the first magnetic layer, the second magnetic layer is disposed on the nonmagnetic layer, the first magnetic layer has a cross shape, and the second magnetic layer has a tetragonal shape.

7. The magnetic random access memory according to claim 6, wherein the contact pillar has the same shape as that of the second magnetic layer.

8. The magnetic random access memory according to claim 4, wherein the nonmagnetic layer is disposed on the second magnetic layer, the first magnetic layer is disposed on the nonmagnetic layer, the first magnetic layer has a cross shape, and the second magnetic layer has a tetragonal shape.

9. The magnetic random access memory according to claim 4, wherein contours of corner portions of the cross shape and the tetragonal shape can be approximated by a curvature radius R, and R has a value of 20% or less of L1 or L2.

10. The magnetic random access memory according to claim 4, further comprising:
   a magnetic material disposed on the side surface of the conductive line,
   wherein a position of the bottom surface of the magnetic material is lower than that of the bottom surface of the conductive line.

11. A magnetic random access memory comprising:
   a magneto resistive element comprising a first magnetic layer whose magnetized state changes in accordance with data, a second magnetic layer whose magnetized state is fixed, and a nonmagnetic layer disposed between the first and second magnetic layers;
   a conductive line disposed above the magneto resistive element; and
   a contact pillar which connects the magneto resistive element to the conductive line,
   wherein a ratio (L1/L2) of a maximum length L1 of a first direction to a maximum length L2 of a second direction crossing the first direction at right angles in at least the first magnetic layer of the magneto resistive element is smaller than a ratio (D1/D2) of a maximum length D1 of the first direction to a maximum length D2 of the second direction in the contact pillar, and L2>D2.

12. A magnetic resistive element comprising:
   a first magnetic layer;
   a nonmagnetic layer disposed on the first magnetic layer; and
   a second magnetic layer which is disposed on the nonmagnetic layer and whose magnetized state changes in accordance with data,
   wherein the second magnetic layer has a cross shape in which a maximum length of a first direction is L1 and a maximum length of a second direction crossing the first direction at right angles is L2, and the first magnetic layer has a tetragonal shape in which the maximum length of the first direction is L1.

13. The magneto resistive element according to claim 12, wherein the maximum length of the second direction of the first magnetic layer is L2.

* * * * *